US010304800B2

(12) United States Patent
Chen et al.

(10) Patent No.: US 10,304,800 B2
(45) Date of Patent: May 28, 2019

(54) PACKAGING WITH SUBSTRATES CONNECTED BY CONDUCTIVE BUMPS

(71) Applicant: TAIWAN SEMICONDUCTOR MANUFACTURING COMPANY LTD., Hsinchu (TW)

(72) Inventors: Weiming Chris Chen, Taipei (TW);
Ting-Yu Yeh, Hsinchu (TW);
Chia-Hsin Chen, Tainan (TW);
Tu-Hao Yu, Hsin-Chu (TW);
Kuo-Chiang Ting, Hsinchu (TW);
Shang-Yun Hou, Hsinchu (TW);
Chi-Hsi Wu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/800,962

(22) Filed: Nov. 1, 2017

(65) Prior Publication Data

US 2018/0374821 A1    Dec. 27, 2018

Related U.S. Application Data

(60) Provisional application No. 62/524,151, filed on Jun. 23, 2017.

(51) Int. Cl.
*H01L 23/02* (2006.01)
*H01L 21/00* (2006.01)
(Continued)

(52) U.S. Cl.
CPC ........ *H01L 25/0652* (2013.01); *H01L 21/563* (2013.01); *H01L 21/565* (2013.01); *H01L 23/3128* (2013.01); *H01L 23/3142* (2013.01); *H01L 23/49811* (2013.01); *H01L 23/49816* (2013.01); *H01L 24/11* (2013.01); *H01L 24/16* (2013.01); *H01L 24/17* (2013.01);
(Continued)

(58) Field of Classification Search
CPC . H01L 25/0652; H01L 21/563; H01L 21/565; H01L 23/3128; H01L 23/3142; H01L 24/11; H01L 24/81; H01L 24/17; H01L 23/49816; H01L 23/49811
See application file for complete search history.

(56) References Cited

U.S. PATENT DOCUMENTS 5,476,818 A * 12/1995 Yanof ................... H01L 23/055
257/E21.511
7,235,885 B2 * 6/2007 Horii ................. H01L 23/49816
257/668

(Continued)

*Primary Examiner* — Alonzo Chambliss
(74) *Attorney, Agent, or Firm* — WPAT, P.C., Intellectual Property Attorneys; Anthony King

(57) ABSTRACT

A semiconductor structure includes a first substrate including a first surface and a second surface opposite to the first surface; a first die disposed over the second surface of the first substrate; a plurality of first conductive bumps disposed between the first die and the first substrate; a molding disposed over the first substrate and surrounding the first die and the plurality of first conductive bumps; a second substrate disposed below the first surface of the first substrate; a plurality of second conductive bumps disposed between the first substrate and the second substrate; and a second die disposed between the first substrate and the second substrate.

20 Claims, 24 Drawing Sheets

(51) Int. Cl.
*H01L 25/065* (2006.01)
*H01L 23/31* (2006.01)
*H01L 23/00* (2006.01)
*H01L 21/56* (2006.01)
*H01L 25/00* (2006.01)
*H01L 23/498* (2006.01)
*H01L 25/16* (2006.01)

(52) U.S. Cl.
CPC .............. *H01L 24/81* (2013.01); *H01L 25/50* (2013.01); *H01L 25/16* (2013.01); *H01L 2224/16145* (2013.01); *H01L 2224/16225* (2013.01); *H01L 2224/16227* (2013.01); *H01L 2224/32225* (2013.01); *H01L 2224/73204* (2013.01); *H01L 2225/0652* (2013.01); *H01L 2225/06513* (2013.01); *H01L 2225/06517* (2013.01); *H01L 2225/06548* (2013.01); *H01L 2225/06572* (2013.01); *H01L 2924/1431* (2013.01); *H01L 2924/1434* (2013.01); *H01L 2924/15311* (2013.01); *H01L 2924/18161* (2013.01)

(56) References Cited

U.S. PATENT DOCUMENTS

| | | | |
|---|---|---|---|
| 7,378,733 B1 * | 5/2008 | Hoang | H01L 23/50 257/724 |
| 8,546,187 B2 * | 10/2013 | Koide | H01L 25/0655 257/685 |
| 8,604,615 B2 * | 12/2013 | Lee | H01L 23/3135 257/685 |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2003/0006496 A1 * | 1/2003 | Vaiyapuri | H01L 21/563 257/686 |
| 2009/0206455 A1 * | 8/2009 | Harper | H01L 23/3128 257/659 |
| 2010/0314749 A1 * | 12/2010 | Kurita | H01L 21/563 257/698 |
| 2011/0210444 A1 * | 9/2011 | Jeng | H01L 23/13 257/738 |
| 2011/0278732 A1 * | 11/2011 | Yu | H01L 23/481 257/774 |
| 2012/0061853 A1 * | 3/2012 | Su | H01L 21/563 257/778 |
| 2014/0124949 A1 * | 5/2014 | Paek | H01L 23/49827 257/774 |
| 2015/0028478 A1 * | 1/2015 | Meyer | H01L 25/0655 257/738 |
| 2016/0079207 A1 * | 3/2016 | Yamaguchi | H01L 25/065 257/738 |
| 2016/0189980 A1 * | 6/2016 | Paek | H01L 23/49894 438/126 |

\* cited by examiner

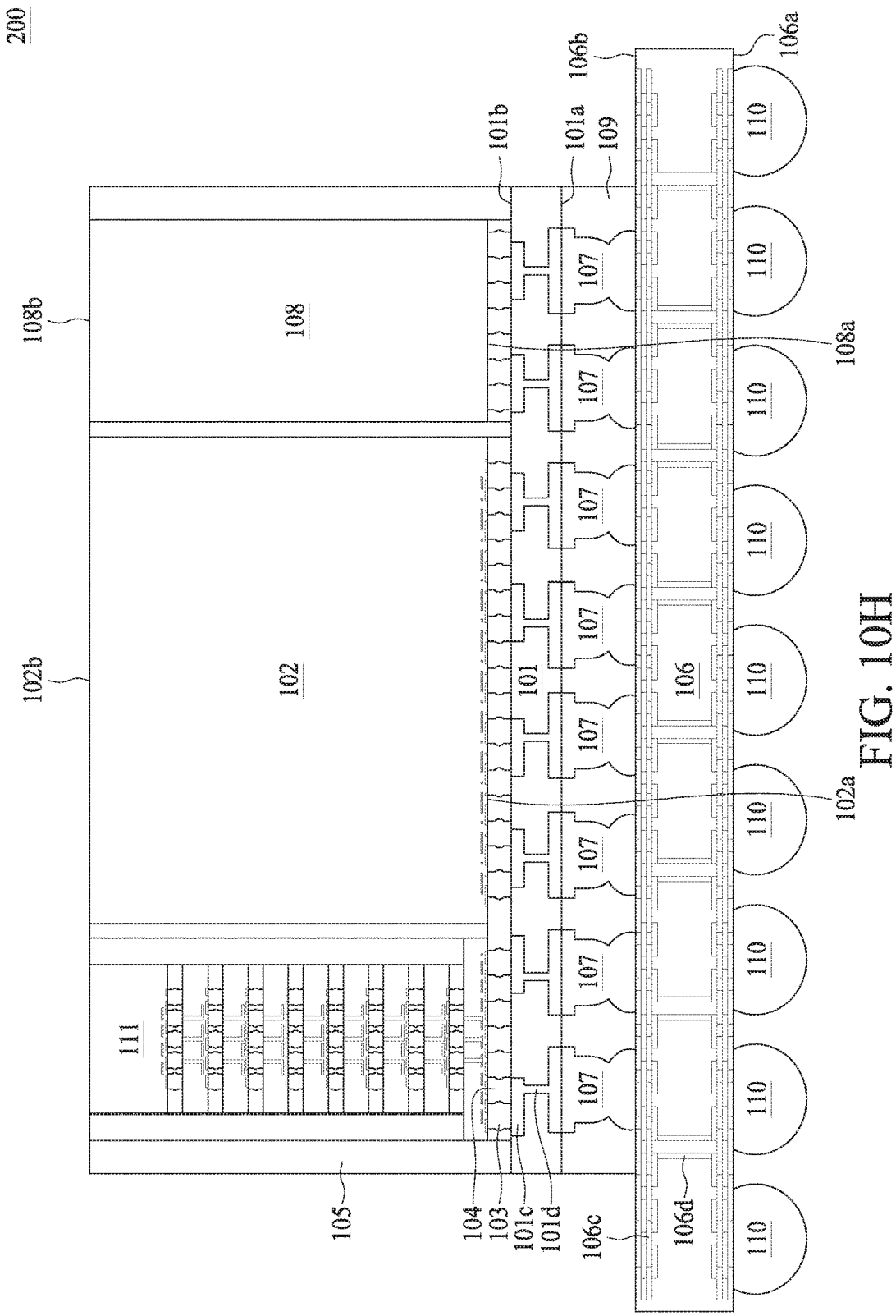

PACKAGING WITH SUBSTRATES CONNECTED BY CONDUCTIVE BUMPS

PRIORITY CLAIM AND CROSS-REFERENCE

This application claims the benefit of U.S. provisional application Ser. No. 62/524,151 filed on Jun. 23, 2017 and entitled "Semiconductor Structure and Manufacturing Method Thereof", the disclosure of which is hereby incorporated by reference in its entirety.

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a chip on wafer on substrate (CoWoS) is widely used to integrate several chips into a single semiconductor device. During the CoWoS operation, a number of chips are assembled on a single semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor structural configuration, delamination of components, or other issues, resulting in a high yield loss of the semiconductor device and increase of manufacturing cost. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 10A-10I are schematic views of manufacturing a semiconductor structure by a method of FIG. 9 in accordance with some embodiments of the present disclosure.

DETAILED DESCRIPTION OF THE DISCLOSURE

Figure 1:
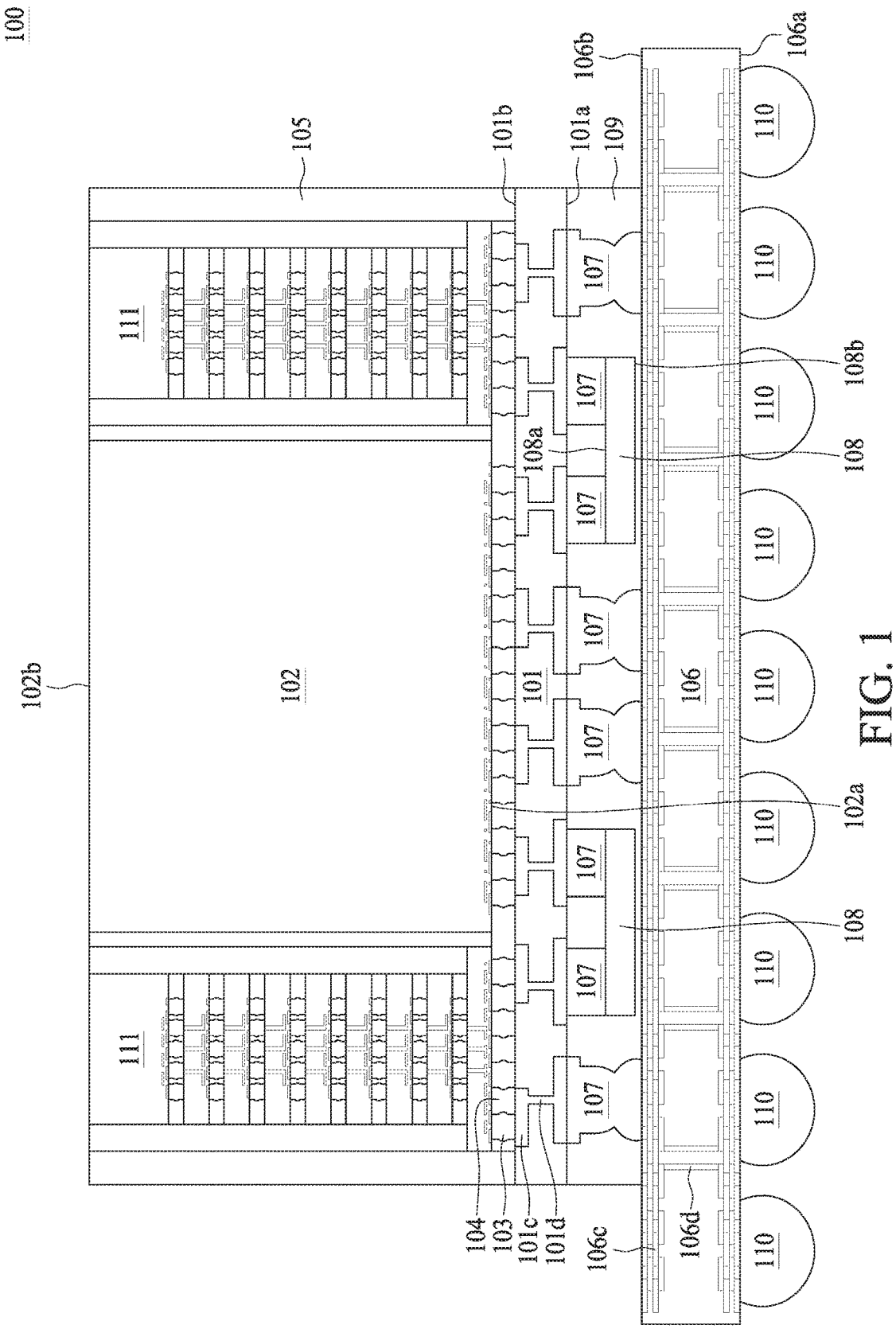
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A semiconductor chip is manufactured by a number of operations. During the manufacturing process, the semiconductor chips with different functionalities and dimensions are integrated into a single module. Several semiconductor chips are disposed over a substrate by a surface mount technology (SMT) to integrate the semiconductor chips on the substrate. However, such SMT integration would result in a long electrical connection chips (for example, substantially greater than about 1 mm) between the semiconductor. Although the electrical connection between the semiconductor chips can be shortened by embedding the semiconductor chips into the substrate, such embedment would lower an overall capacitance or capacitance density.

In the present disclosure, a semiconductor structure is disclosed. The semiconductor structure includes a first substrate, a first die disposed over a surface of the first substrate, a second die disposed over an opposite surface of the first substrate, a second substrate disposed below the first substrate, and several conductive bumps bonding the first substrate with the second substrate. The second die is bonded with the first substrate, disposed between the first substrate and the second substrate, and surrounded by the conductive bumps. In some embodiments, the second die is disposed over the first substrate and surrounded by a molding. Since the second die is bonded and electrically connected with the first substrate, an electrical connection between the first die and the second die is minimized. As such, an electrical performance of the semiconductor structure is improved.

Figure 2:
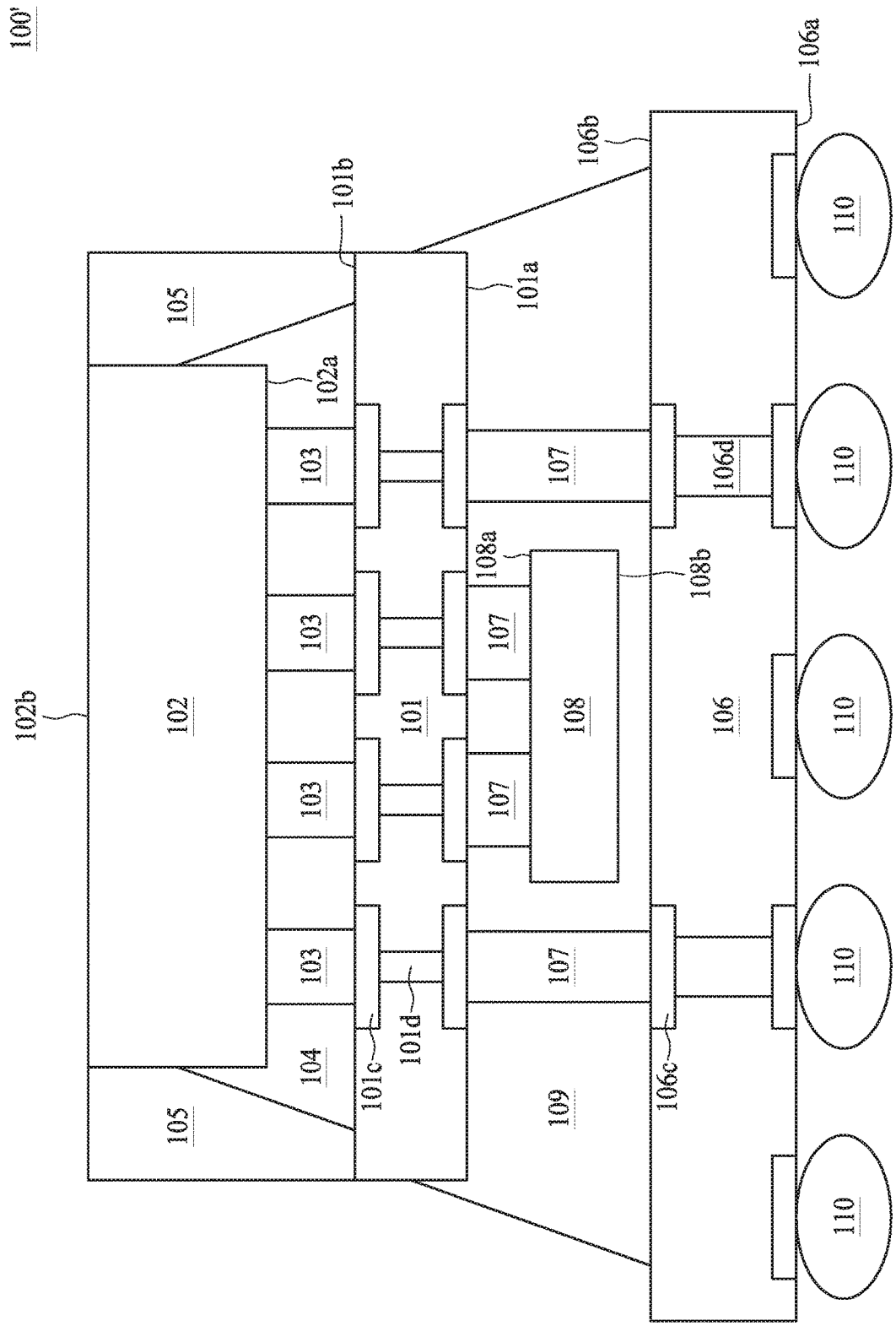
FIG. 2 is a schematic cross sectional view of a semiconductor structure in accordance with some embodiments of the present disclosure.

FIG. 1 and FIG. 2 are schematic cross sectional views of a semiconductor structure 100 in accordance with various embodiments of the present disclosure. In some embodiments, the semiconductor structure 100 includes a first substrate 101, a first die 102, a plurality of first conductive bumps 103, a molding 105, a second substrate 106, a second conductive bump 107 and a second die 108. In some embodiments, the semiconductor structure 100 can include a third die 111 such as a high bandwidth memory (HBM) die as shown in FIG. 1. In some embodiments, the third die 111 includes a plurality of HBM dies stacking over each other, and the HBM dies are electrically connected by several connectors.

In some embodiments, the semiconductor structure 100 is a semiconductor package. In some embodiments, the semiconductor structure 100 is a chip on wafer on substrate (CoWoS) packaging structure. In some embodiments, the semiconductor structure 100 is a system on integrated chips (SoIC) packaging structure. In some embodiments, the semiconductor structure 100 is a three dimensional integrated circuit (3D IC).

In some embodiments, the first substrate 101 is a semiconductive substrate. In some embodiments, the first substrate 101 includes semiconductive material such as silicon, germanium, gallium, arsenic, or combinations thereof. In some embodiments, the first substrate 101 is an interposer or the like. In some embodiments, the first substrate 101 is a silicon substrate or silicon interposer. In some embodiments, the first substrate 101 includes organic material. In some embodiments, the first substrate 101 includes ceramic, polymer or the like. In some embodiments, the first substrate 101 has a quadrilateral, rectangular, square, polygonal or any other suitable shape.

In some embodiments, the first substrate 101 includes a first surface 101a and a second surface 101b opposite to the first surface 101a. In some embodiments, a first conductive pad 101c is disposed at the first surface 101a or the second surface 101b. In some embodiments, the first conductive pad 101c is disposed within or on the first surface 101a or the second surface 101b. In some embodiments, the first conductive pad 101c is surrounded by the first substrate 101. In some embodiments, the first conductive pad 101c includes a conductive material such as chromium, copper, gold, titanium, silver, nickel, palladium or tungsten, etc. In some embodiments, the first conductive pad 101c is a solderable surface and serves as a platform for receiving a conductive structure.

In some embodiments, a first via 101d is disposed within the first substrate 101. In some embodiments, first via 101d extends through the first substrate 101. In some embodiments, the first via 101d is extended between the first surface 101a and the second surface 101b of the first substrate 101. In some embodiments, the first via 101d includes a conductive material such as copper, silver, gold, aluminum, etc. In some embodiments, the first via 101d is a through substrate via or a through silicon via (TSV). In some embodiments, the first via 101d is electrically connected with the first conductive pad 101c. In some embodiments, the first via 101d is disposed between two of the first conductive pads 101c.

In some embodiments, the first die 102 is disposed over the first substrate 101. In some embodiments, the first die 102 is disposed over the second surface 101b of the first substrate 101. In some embodiments, the first die 102 is fabricated with a predetermined functional circuit within the first die 102. In some embodiments, the first die 102 is singulated from a semiconductive wafer by a mechanical or laser blade. In some embodiments, the first die 102 comprises a variety of electrical circuits suitable for a particular application. In some embodiments, the electrical circuits include various devices such as transistors, capacitors, resistors, diodes and/or the like. In some embodiments, the first die 102 is a logic device die, application-specific integrated circuit (ASIC) die, application processing (AP) die, memory die, high bandwidth memory (HBM) die or the like. In some embodiments, the first die 102 is a chip or a package. In some embodiments, the first die 102 has a top cross section (a cross section from the top view of the semiconductor structure 100 as shown in FIG. 1) in a quadrilateral, a rectangular or a square shape.

In some embodiments, the first die 102 includes a third surface 102a and a fourth surface 102b opposite to the third surface 102a. In some embodiments, the third surface 102a is a front side or an active side that several electrical components are disposed thereon. In some embodiments, the fourth surface 102b is a back side or an inactive side that electrical component disposed thereon is absent. In some embodiments, the third surface 102a faces to the first substrate 101.

In some embodiments, the first die 102 is bonded over the first substrate 101 by several first conductive bumps 103. In some embodiments, the first conductive bump 103 is disposed between the first substrate 101 and the first die 102. In some embodiments, the first conductive bump 103 is disposed between the second surface 101b of the first substrate 101 and the third surface 102a of the first die 102. In some embodiments, the first die 102 is electrically connected to the first substrate 101 through the first conductive bump 103. In some embodiments, the first conductive bump 103 is disposed between the second surface 101b of the first substrate 101 and the third die 111, and the third die 111 is electrically connected to the first substrate 101 through the first conductive bump 103. In some embodiments, the first conductive bump 103 is electrically connected to the first via 101d through the first conductive pad 101c.

In some embodiments, the first conductive bump 103 is in a cylindrical, spherical or hemispherical shape. In some embodiments, the first conductive bump 103 is a solder joint, a solder bump, a solder ball, microbump or the like. In some embodiments, the first conductive bump 103 is a conductive pillar or post. In some embodiments, the first conductive bump 103 includes metals such as lead, tin, copper, gold, nickel, etc.

In some embodiments, a first underfill material 104 is disposed over the first substrate 101 and surrounds the first conductive bump 103 and the first die 102. In some embodiments, a first underfill material 104 is disposed over the first substrate 101 and surrounds the first conductive bump 103, the first die 102 and the third die 111. In some embodiments, the first underfill material 104 is disposed over the second surface 101b of the first substrate 101. In some embodiments, the first underfill material 104 encapsulates the first conductive bump 103. In some embodiments, the first underfill material 104 is in contact with the second surface 101b of the first substrate 101, the third surface 102a of the first die 102 and a portion of a sidewall of the first die 102. In some embodiments, the first underfill material 104 fills spacing between two adjacent first conductive bumps 103. In some embodiments, the first underfill material 104 is an electrically insulated adhesive for protecting the first conductive bump 103 or securing a bonding between the first die 102 and the first substrate 101, and a bonding between the third die 111 and the first substrate 101. In some embodiments, the first underfill material 104 includes epoxy, resin, epoxy molding compounds or etc.

In some embodiments, the molding 105 is disposed over the first substrate 101 and surrounds the first die and the third die 111. In some embodiments, the molding 105 is disposed over the second surface 101b of the first substrate 101 and surrounds the first die 102, the third die 111, the first underfill material 104 and the first conductive bump 103. In some embodiments, the molding 105 is in contact with a sidewall of the first die 102, the first underfill material 104 and the second surface 101b of the first substrate 101. In some embodiments, the fourth surface 102b of the first die 102 is exposed from the molding 105. In some embodiments, the molding 105 can be a single layer film or a composite stack. In some embodiments, the molding 105 includes various materials, such as molding compound, molding underfill, epoxy, resin, or the like. In some embodiments, the molding 105 has a high thermal conductivity, a low moisture absorption rate and a high flexural strength.

In some embodiments, the second substrate 106 is a semiconductive substrate. In some embodiments, the second substrate 106 includes semiconductive material such as silicon, germanium, gallium, arsenic, or combinations thereof. In some embodiments, the first second substrate 106 is a silicon substrate. In some embodiments, the second substrate 106 includes organic material. In some embodiments, the second substrate 106 includes resin, epoxy, glass, ceramic, polymer or the like. In some embodiments, the second substrate 106 has a quadrilateral, rectangular, square, polygonal or any other suitable shape.

In some embodiments, the second substrate 106 includes a fifth surface 106a and a sixth surface 106b opposite to the fifth surface 106a. In some embodiments, the second substrate 106 is disposed below the first substrate 101, the first die 102 and the molding 105. In some embodiments, the second substrate 106 is disposed below the first surface 102a of the first substrate 101. In some embodiments, the sixth surface 106b of the second substrate 106 faces to the first surface 101a of the first substrate 101.

In some embodiments, a second conductive pad 106c is disposed at the fifth surface 106a or the sixth surface 106b. In some embodiments, the second conductive pad 106c is disposed within or on the fifth surface 106a or the sixth surface 106b. In some embodiments, the second conductive pad 106c is surrounded by the second substrate 106. In some embodiments, the second conductive pad 106c includes a conductive material such as chromium, copper, gold, titanium, silver, nickel, palladium or tungsten, etc. In some embodiments, the second conductive pad 106c is a solderable surface and serves as a platform for receiving a conductive structure.

In some embodiments, a second via 106d is disposed within the second substrate 106. In some embodiments, second via 106d extends through the second substrate 106. In some embodiments, the second via 106d is extended between the fifth surface 106a and the sixth surface 106b of the second substrate 106. In some embodiments, the second via 106d includes a conductive material such as copper, silver, gold, aluminum, etc. In some embodiments, the second via 106d is a plated through hole (PTH). In some embodiments, the second via 106d is electrically connected with the second conductive pad 106c. In some embodiments, the second via 106d is disposed between two of the second conductive pads 106c.

In some embodiments, the first substrate 101 is bonded over the second substrate 106 by several second conductive bumps 107. In some embodiments, the second conductive bump 107 is disposed between the first substrate 101 and the second substrate 106. In some embodiments, the second conductive bump 107 is disposed between the first surface 101a of the first substrate 101 and the sixth surface 106b of the second substrate 106. In some embodiments, the first substrate 101 is electrically connected to the second substrate 106 through the second conductive bump 107. In some embodiments, the second conductive bump 106c and the second via 106d are electrically connected to the second conductive bump 107. In some embodiments, the second conductive bump 107 is electrically coupled with the first conductive pad 101c and the second conductive pad 106c.

In some embodiments, the second conductive bump 107 is in a cylindrical, spherical or hemispherical shape. In some embodiments, the second conductive bump 107 is a solder joint, a solder bump, a solder ball, a ball grid array (BGA) ball, a controlled collapse chip connection (C4) bump, microbump or the like. In some embodiments, the second conductive bump 107 is a conductive pillar or post. In some embodiments, the second conductive bump 107 includes metals such as lead, tin, copper, gold, nickel, etc.

In some embodiments, the second die 108 is disposed below the first substrate 101 and above the second substrate 106. In some embodiments, the second die 108 is disposed between the first substrate 101 and the second substrate 106. In some embodiments, the second die 108 is surrounded by the second conductive bumps 107. In some embodiments, the second die 108 is disposed between the first die 102 and the second substrate 106. In some embodiments, the second die 108 is disposed between the molding 105 and the second substrate 106.

In some embodiments, the second die 108 is fabricated with a predetermined functional circuit within the second die 108. In some embodiments, the second die 108 is singulated from a semiconductive wafer by a mechanical or laser blade. In some embodiments, the second die 108 comprises a variety of electrical circuits suitable for a particular application. In some embodiments, the electrical circuits include various devices such as transistors, capacitors, resistors, diodes and/or the like. In some embodiments, the second die 108 is an integrated passive die (IPD). In some embodiments, the second die 108 includes a capacitor, a passive device or the like. In some embodiments, the second die 108 is a chip or a package. In some embodiments, the second die 108 has a top cross section (a cross section from the top view of the semiconductor structure 100 as shown in FIGS. 1 and 2) in a quadrilateral, a rectangular or a square shape.

In some embodiments, the second die 108 includes a seventh surface 108a and a eighth surface 108b opposite to the seventh surface 108a. In some embodiments, the seventh surface 108a is a front side or an active side that several electrical components are disposed thereon. In some embodiments, the eighth surface 108b is a back side or an inactive side that electrical component disposed thereon is absent. In some embodiments, the seventh surface 108a faces to the fifth surface 101a of the first substrate 101. In some embodiments, the eighth surface 108b faces to the sixth surface 106b of the second substrate 106.

In some embodiments, the second die 108 is bonded below the first substrate 101 by the second conductive bumps 107. In some embodiments, the second conductive bump 107 is disposed between the first substrate 101 and the second die 108. In some embodiments, the second die 108 is attached to the first surface 101a of the first substrate 101 by the second conductive bump 107. In some embodiments, the second conductive bump 107 is disposed between the first surface 101a of the first substrate 101 and the seventh surface 108a of the second die 108. In some embodiments, the second die 108 is electrically connected to the first substrate 101 and the first die 102 through the second conductive bump 107. In some embodiments, the second die 108 is electrically connected to the first die 102 through the second conductive bump 107, the first conducive pad 101c, the first via 101d and the first conductive bump 103.

In some embodiments, a second underfill material 109 is disposed over the second substrate 106 and surrounds the second conductive bump 107 and the second die 108. In some embodiments, the second underfill material 109 is disposed between the first substrate 101 and the second substrate 106. In some embodiments, a portion of the first substrate 101 is surrounded by the second underfill material 109. In some embodiments, the second underfill material 109 is disposed over the sixth surface 106b of the second substrate 106. In some embodiments, the second underfill material 109 is disposed between the first surface 101a of the first substrate 101 and the sixth surface 106b of the second substrate 106. In some embodiments, the second underfill material 109 encapsulates the second conductive bump 107. In some embodiments, the second die 108 is entirely encapsulated by the second underfill material 109. In some embodiments, at least a portion of the second underfill material 109 is disposed between the second die 108 and the second substrate 106. In some embodiments, the seventh surface 108a, the eighth surface 108b and a sidewall of the second die 108 are in contact with the second underfill material 109. In some embodiments, at least one of the second conductive bumps 107 is disposed between the second die 108 and a sidewall of the second underfill material 109. In some embodiments, the second underfill material 109 fills spacing between two adjacent second conductive bumps 107. In some embodiments, the second underfill material 109 is an electrically insulated adhesive for protecting the second conductive bump 107 or securing a bonding between the first substrate 101 and the second substrate 106 or between the first substrate 101 and the second die 108. In some embodiments, the second underfill material 109 includes epoxy, resin, epoxy molding compounds or etc.

In some embodiments, several third conductive bumps 110 are disposed below the second substrate 106. In some embodiments, the third conductive bump 110 is disposed at the fifth surface 106a of the second substrate 106. In some embodiments, the third conductive bump 110 is disposed at the second conductive pad 106c. In some embodiments, the third conductive bump 110 is electrically connected to the second via 106d. In some embodiments, the third conductive bump 110 is in a cylindrical, spherical or hemispherical shape. In some embodiments, the third conductive bump 110 is a solder joint, a solder bump, a solder ball, a ball grid array (BGA) ball, a controlled collapse chip connection (C4) bump, microbump or the like. In some embodiments, the third conductive bump 110 is a conductive pillar or post. In some embodiments, the third conductive bump 110 includes metals such as lead, tin, copper, gold, nickel, etc.

Figure 3:
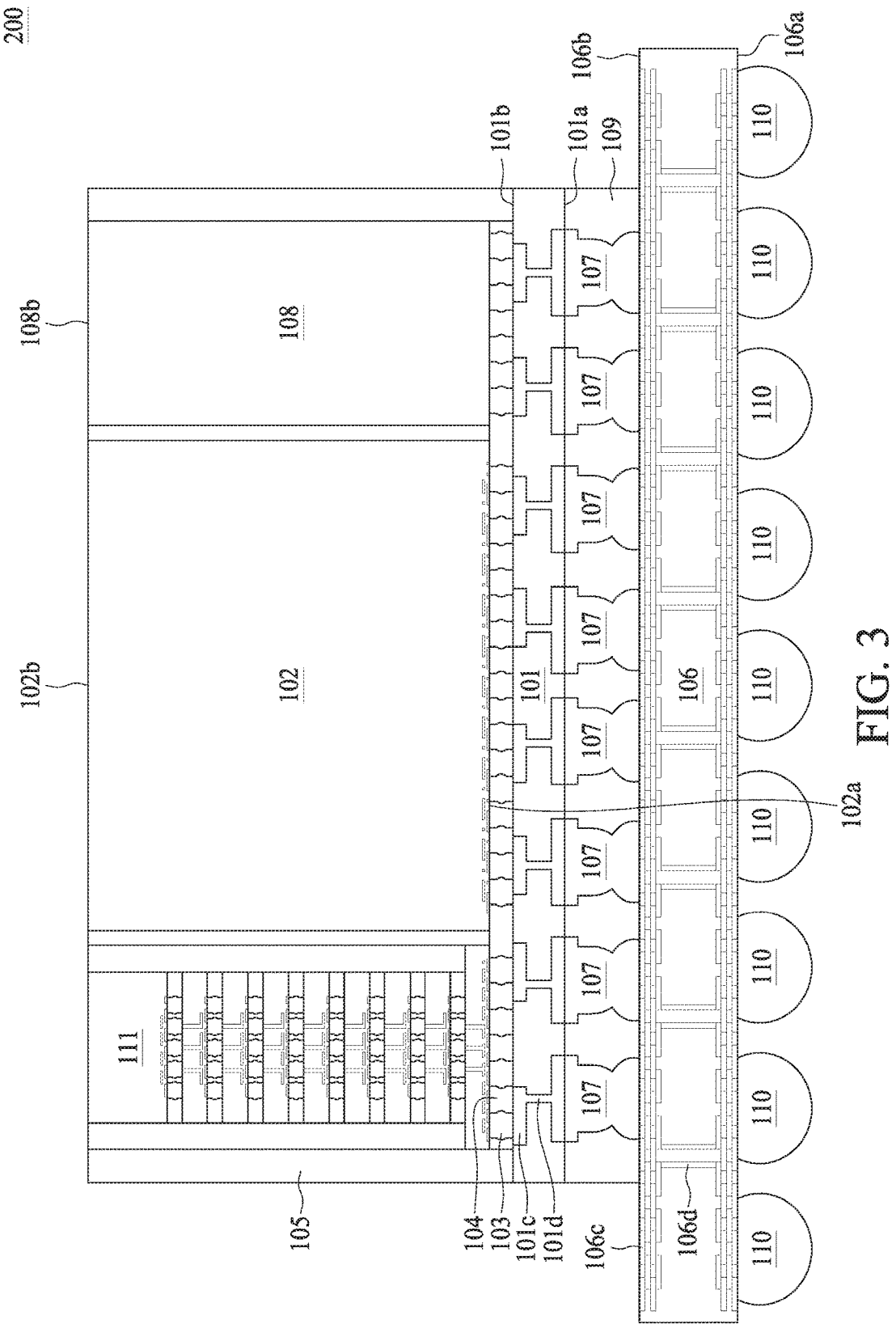
FIG. 3 is a schematic cross sectional view of a semiconductor structure in accordance with some embodiments of the present disclosure.
Figure 4:
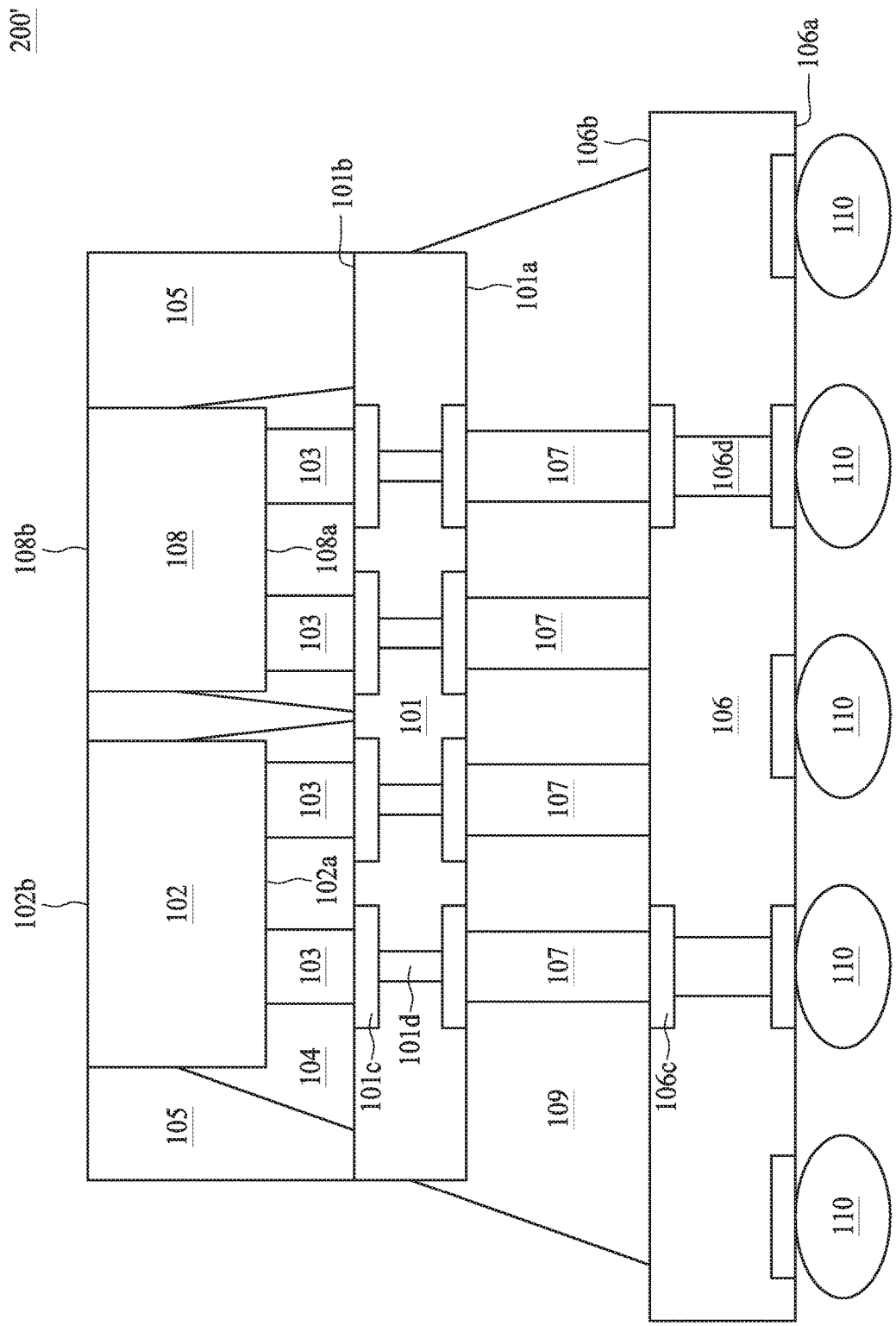
FIG. 4 is a schematic cross sectional view of a semiconductor structure in accordance with some embodiments of the present disclosure.

FIGS. 3 and 4 are schematic cross sectional views of a semiconductor structure 200 and 200' in accordance with various embodiments of the present disclosure. In some embodiments, the semiconductor structure 200 includes a first substrate 101, a first die 102, a plurality of first conductive bumps 103, a first underfill material 104, a molding 105, a second substrate 106, a second conductive bump 107, a second underfill material 109 and a third conductive bump 110, which have similar configurations as those described above or illustrated in FIG. 1.

In some embodiments, a second die 108 is disposed over the first substrate 101 and surrounded by the molding 105. In some embodiments, a third die 111 is disposed over the first substrate 101 and surrounded by the molding 105. In some embodiments, the second die 108 and the third die 111 are disposed over the second surface 101b of the first substrate 101 and adjacent to the first die 102. In some embodiments, the second die 108 and the third die 111 are bonded over the first substrate 101 by the first conductive bumps 103. In some embodiments, the first conductive bump 103 is disposed between the second die 108 and the first substrate 101, and between the third die 111 and the first substrate 101. In some embodiments, the first underfill material 104 surrounds a portion of the second die 108 and the first conductive bump 103. In some embodiments, a eighth surface 108b of the second die 108 is exposed from the molding 105. In some embodiments, a sidewall of the second die 108 is in contact with the molding 105. In some embodiments, the second die 108 is a capacitive or passive device. In some embodiments, the second die 108 includes capacitor or passive device. In some embodiments, the second die 108 is an integrated passive device (IPD). In some embodiments, the third die 111 is a high bandwidth memory (HBM) die. In some embodiments, the third die 111 includes a plurality of HBM dies stacking over each other, and the HBM dies are electrically connected by several connectors.

Figure 5:
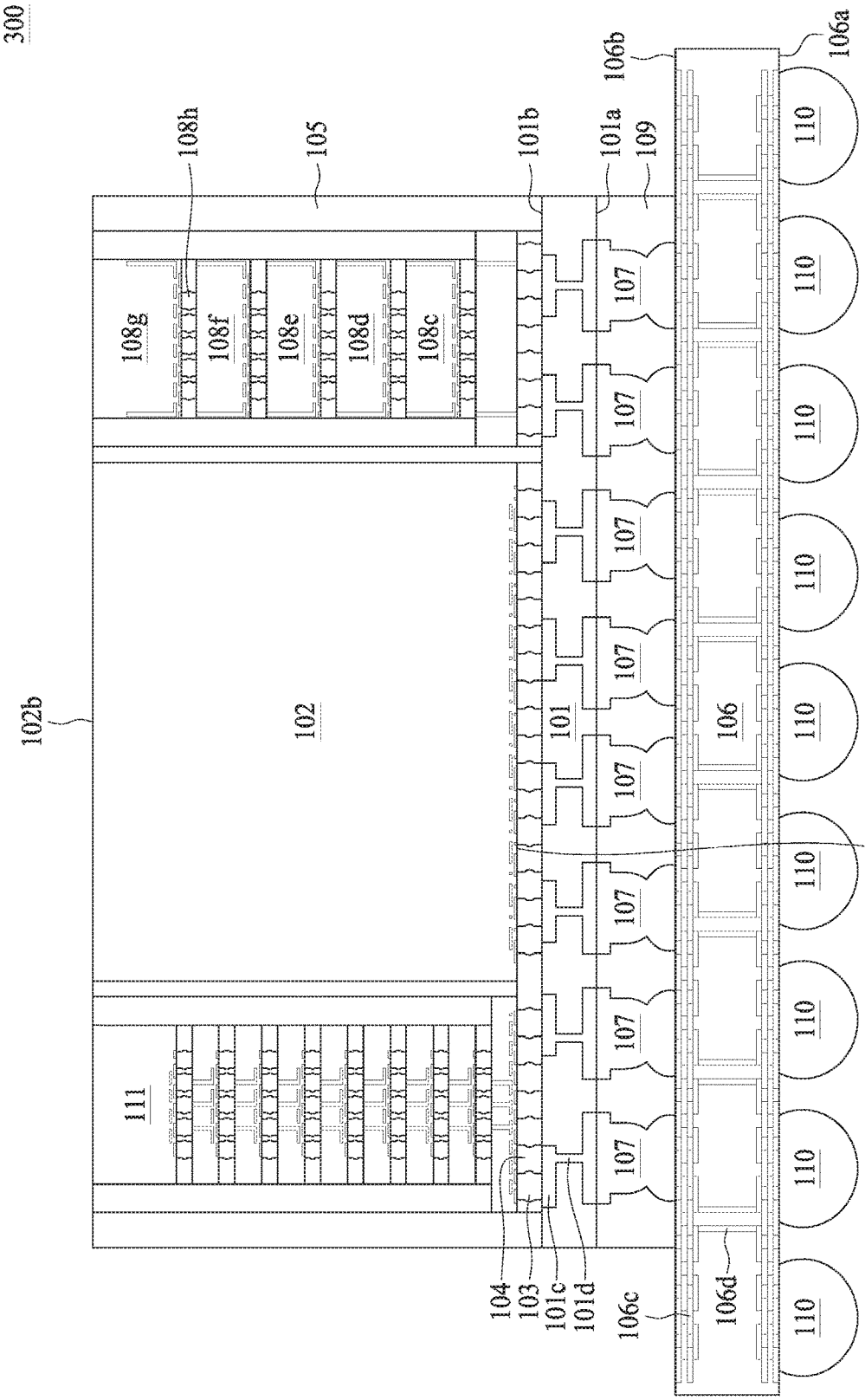
FIG. 5 is a schematic cross sectional view of a semiconductor structure in accordance with some embodiments of the present disclosure.
Figure 6:
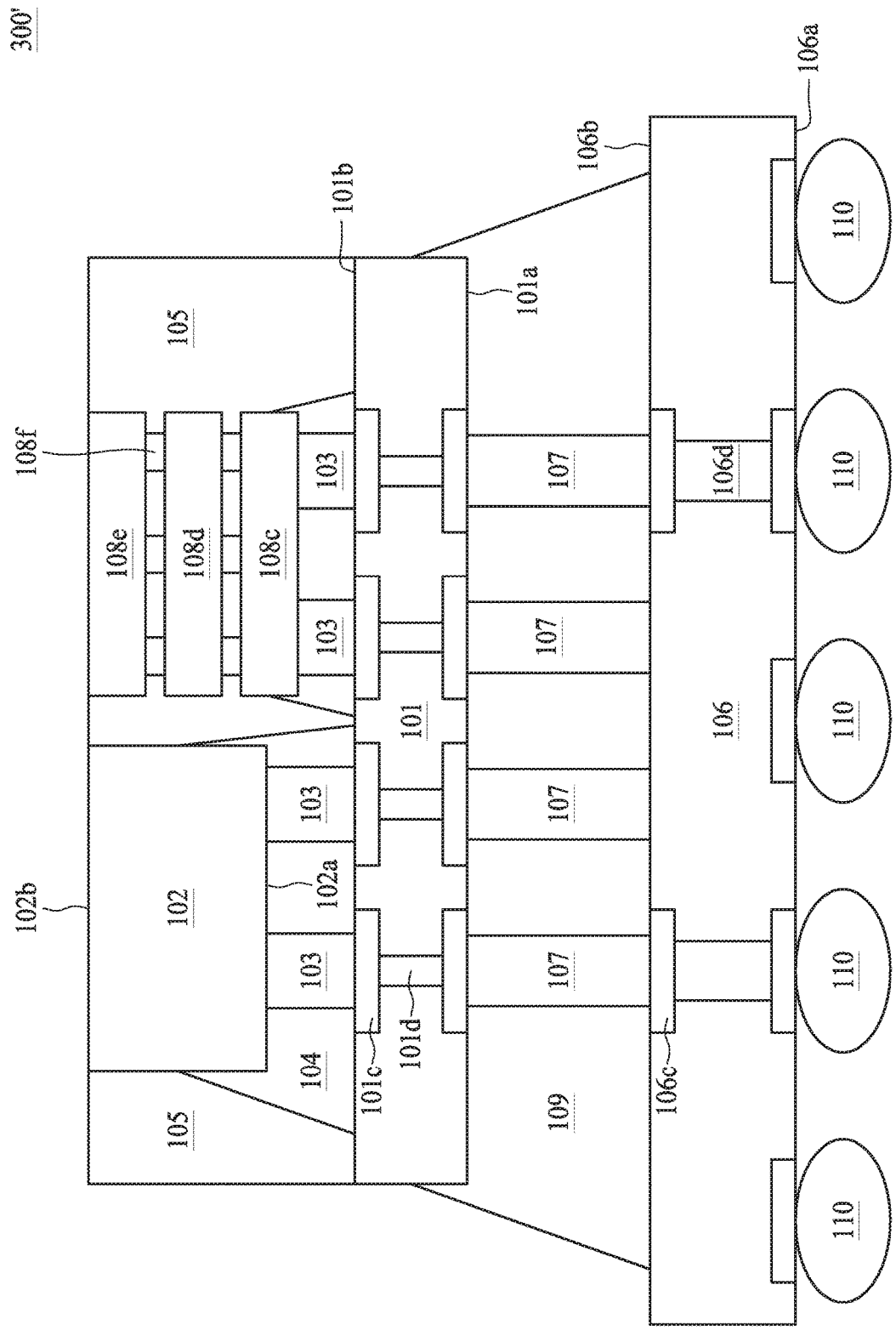
FIG. 6 is a schematic cross sectional view of a semiconductor structure in accordance with some embodiments of the present disclosure.

FIGS. 5 and 6 are schematic cross sectional views of a semiconductor structure 300 and 300' in accordance with various embodiments of the present disclosure. In some embodiments, the semiconductor structure 300 includes a first substrate 101, a first die 102, a first conductive bump 103, a first underfill material 104, a molding 105, a second substrate 106, a second conductive bump 107, a second underfill material 109 and a third conductive bump 110, which have similar configurations as those described above or illustrated in FIG. 1 or 2.

In some embodiments, a second die 108 includes several passive dies (108c, 108d, 108e, 108f, 108g) stacking over each other is disposed over the first substrate 101 as shown in FIGS. 5 and 6. In some embodiments, a third die 111 is disposed over the first substrate 101 as shown in FIG. 5. In some embodiments, the passive dies (108c, 108d, 108e, 108f, 108g) are electrically connected by several connectors

108h. In some embodiments, the connector 108f is a solder bump, a solder ball, microbump, conductive pillar or the like. In some embodiments, the passive dies (108c, 108d, 108e, 108f, 108g) are surrounded by the molding 108. In some embodiments, a surface of one of the passive dies (108c, 108d, 108e, 108f, 108g) is exposed from the molding 105.

Figure 7:
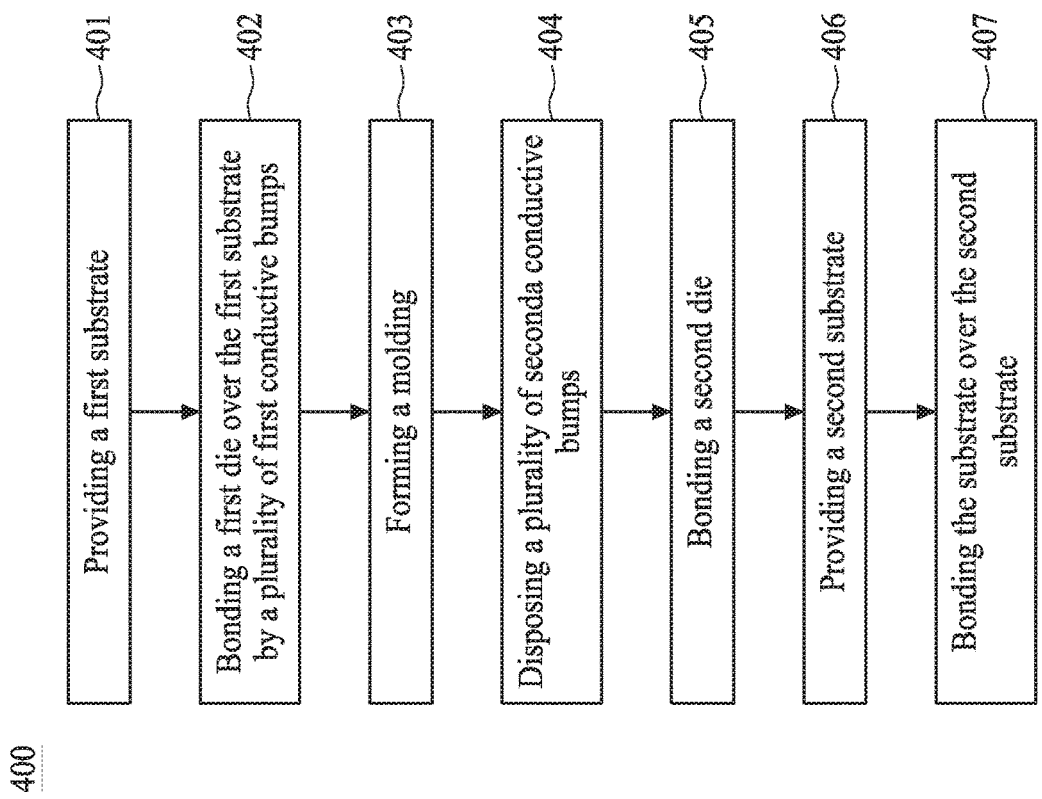
FIG. 7 is a flow diagram of a method of manufacturing a semiconductor structure in accordance with some embodiments of the present disclosure.

In the present disclosure, a method of manufacturing a semiconductor structure 100 is also disclosed. In some embodiments, the semiconductor structure 100 is formed by a method 400. The method 400 includes a number of operations and the description and illustration are not deemed as a limitation as the sequence of the operations. FIG. 7 is an embodiment of the method 400 of manufacturing the semiconductor structure 100 and 100'. The method 400 includes a number of operations (401, 402, 403, 404, 405, 406 and 407).

Figure 8A:
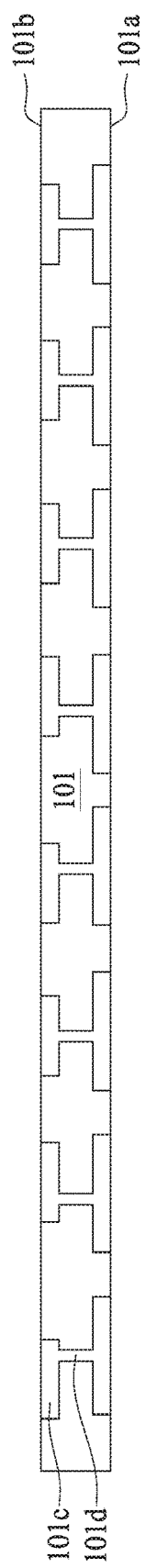
FIGS. 8A-8G are schematic views of manufacturing a semiconductor structure by a method of FIG. 7 in accordance with some embodiments of the present disclosure.

In operation 401, a first substrate 101 is provided or received as shown in FIG. 8A. In some embodiments, the first substrate 101 includes a first surface 101a and a second surface 101b opposite to the first surface 101a. In some embodiments, the first substrate 101 is an interposer. In some embodiments, the first substrate 101 has configuration similar to the one described above or illustrated in FIG. 1.

In some embodiments, a first conductive pad 101c is formed over the first surface 101a or the second surface 101b of the first substrate 101. In some embodiments, the first conductive pad 101c is formed by removing a portion of the first substrate 101 to form an opening, and then disposing a conductive material into the opening to form the first conductive pad 101c. In some embodiments, the removal of the portion of the first substrate 101 includes photolithography, etching or any other suitable operations. In some embodiments, the disposing of the conductive material includes sputtering, electroplating or any other suitable operations. In some embodiments, the conductive material includes copper, silver, gold, aluminum, etc. In some embodiments, the first conductive pad 101c has configuration similar to the one described above or illustrated in FIGS. 1 and 2.

In some embodiments, a first via 101d is formed within the first substrate 101. In some embodiments, the first via 101d is extended through the first substrate 101. In some embodiments, the first via 101d is electrically connected with the first conductive pad 101c. In some embodiments, the first via 101d is extended between the first surface 101a and the second surface 101b of the first substrate 101. In some embodiments, the first via 101d is a through substrate via or a through silicon via (TSV). In some embodiments, the first via 101d is formed by removing a portion of the first substrate 101 to form an opening and then disposing a conductive material into the opening to form the first via 101d. In some embodiments, the removal of the portion of the first substrate 101 includes photolithography, etching or any other suitable operations. In some embodiments, the disposing of the conductive material includes sputtering, electroplating or any other suitable operations. In some embodiments, the conductive material includes copper, silver, gold, aluminum, etc. In some embodiments, the first via 101d has configuration similar to the one described above or illustrated in FIGS. 1 and 2.

Figure 8B:
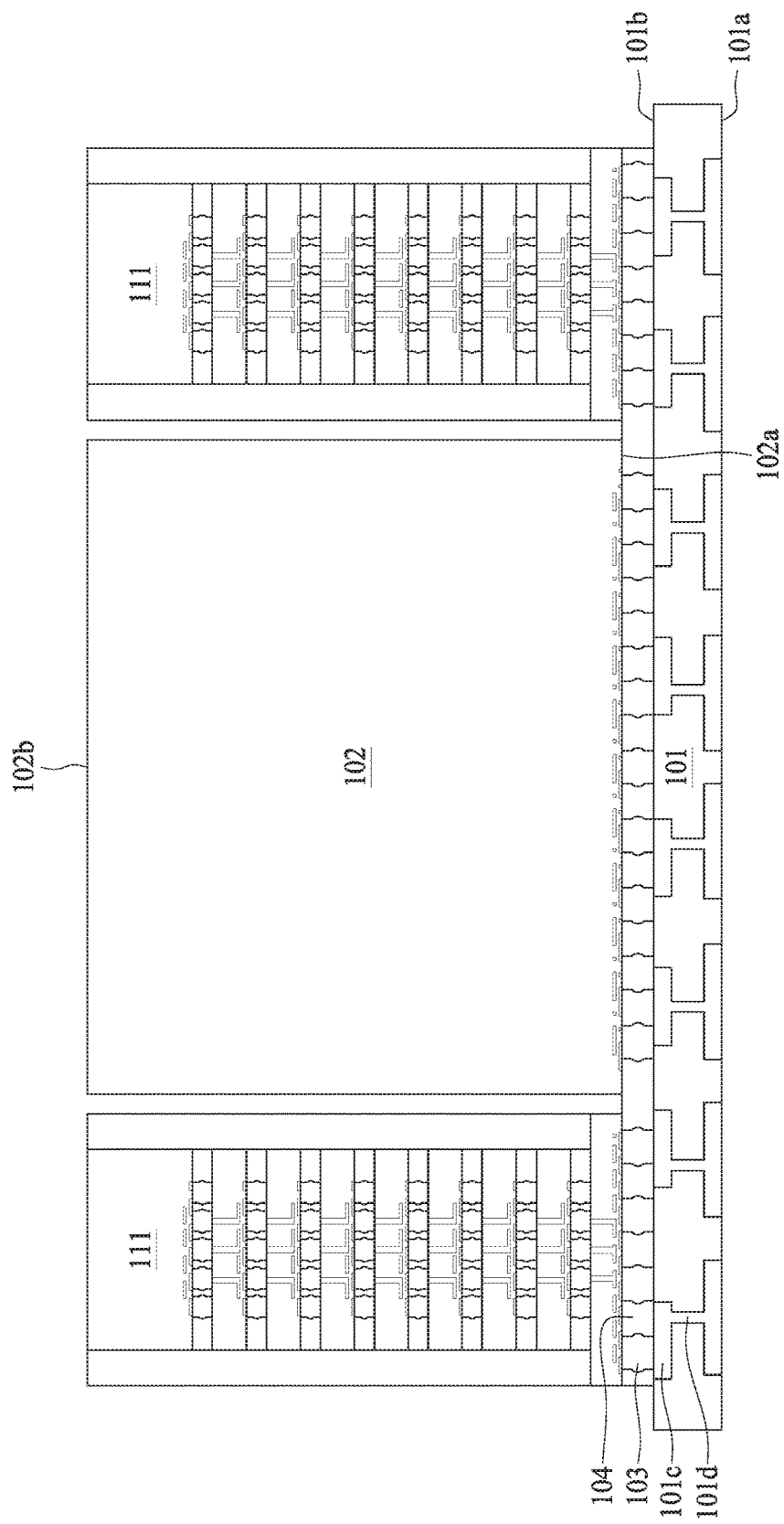

In operation 402, a first die 102 is bonded over the first substrate 101 by a first conductive bump 103 as shown in FIG. 8B. In some embodiments, a third die is bonded over the first substrate 101 by a first conductive bump 103. In some embodiments, the first die 102 is disposed over the second surface 101b of the first substrate 101. In some embodiments, the first die 102 is a logic device die, application-specific integrated circuit (ASIC) die, application processing (AP) die, memory die, high bandwidth memory (HBM) die or the like. In some embodiments, the first die 102 includes a third surface 102a and a fourth surface 102b opposite to the third surface 102a. In some embodiments, the first die 102 has configuration similar to the one described above or illustrated in FIG. 1. In some embodiments, the third die 111 includes a plurality of HBM dies stacking over each other, and the HBM dies are electrically connected by several connectors.

In some embodiments, the first conductive bump 103 is disposed between the third surface 102a of the first die 102 and the second surface 101b of the first substrate 101. In some embodiments, the first die 102 is electrically connected to the first substrate 101 through the first conductive bump 103. In some embodiments, the first conductive bump 103 is disposed by ball dropping, solder pasting, stencil printing or any other suitable operations. In some embodiments, the first conductive bump 103 is a solder joint, a solder bump, a solder ball, microbump or the like. In some embodiments, the first conductive bump 102 is a conductive pillar or post. In some embodiments, the first conductive bump 102 has configuration similar to the one described above or illustrated in FIGS. 1 and 2.

In some embodiments, a first underfill material 104 is disposed over the first substrate 101 and surrounds the first conductive bump 103 and a portion of the first die 102. In some embodiments, the first underfill material 104 surrounds a portion of the first die 102 and the first conductive bump 103 and covers a portion of the second surface 101b of the first substrate 101. In some embodiments, the first underfill material 104 fills gap between adjacent first conductive bumps 103. In some embodiments, the first underfill material 104 is disposed by flowing, injection or any other suitable operations. In some embodiments, the first underfill material 104 has configuration similar to the one described above or illustrated in FIGS. 1 and 2.

Figure 8C:
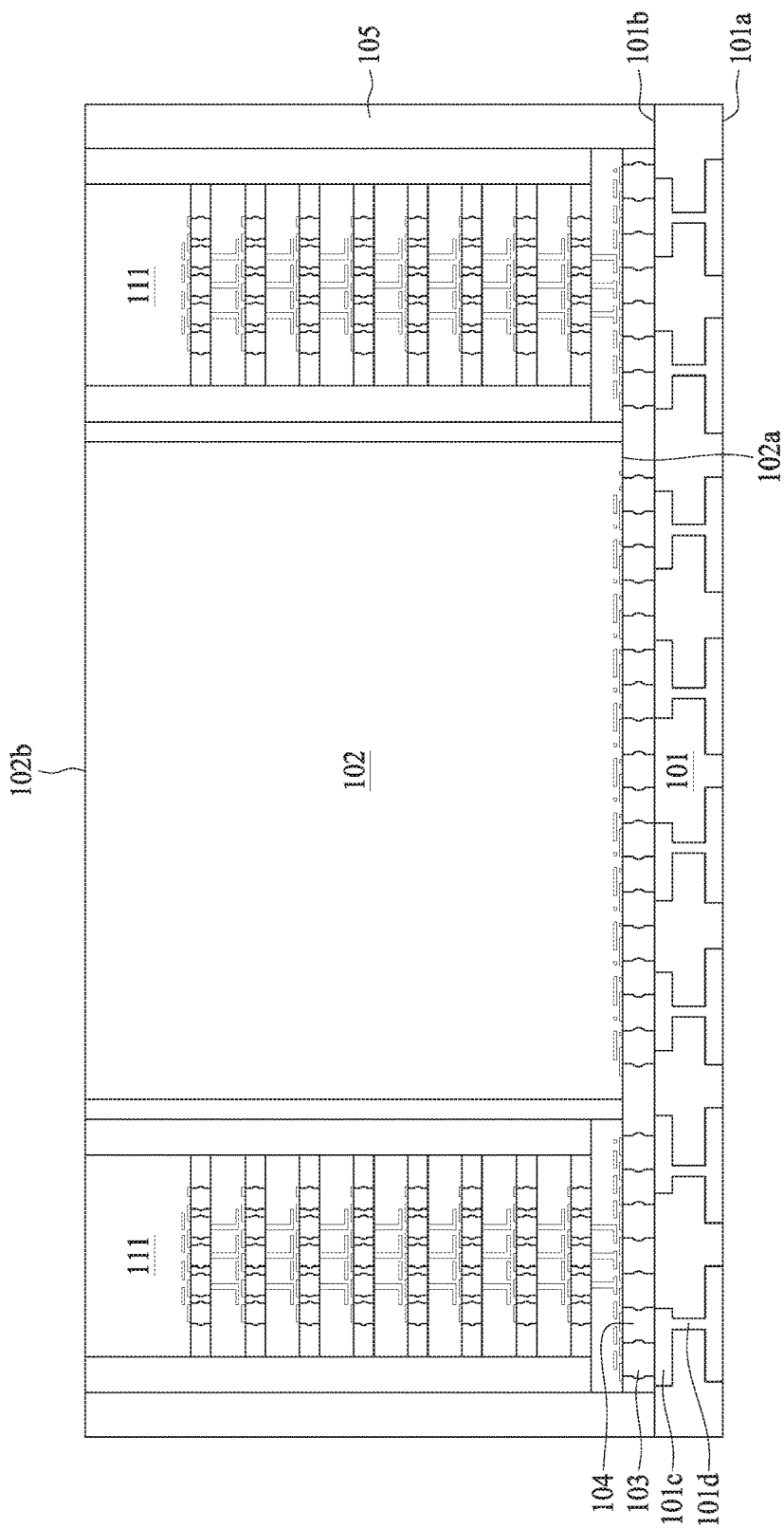

In operation 403, a molding 105 is formed as shown in FIG. 8C. In some embodiments, the molding 105 is formed around the first die 102, the first conductive bump 103 and the first underfill material 104. In some embodiments, the molding 105 is in contact with a portion of a sidewall of the first die 102 and the first underfill material 104. In some embodiments, the molding 105 is formed by transfer molding, injection molding, over molding or any other suitable operations. In some embodiments, the fourth surface 102b of the first die 102 is exposed from the molding 105. In some embodiments, the molding 105 is ground to expose fourth surface 102b of the first die 102. In some embodiments, the molding 105 is ground by grinding, planarization, chemical mechanical polish (CMP) or any other suitable operations. In some embodiments, the molding 105 includes various materials, such as molding compound, molding underfill, epoxy, resin, or the like. In some embodiments, the molding 105 has configuration similar to the one described above or illustrated in FIGS. 1 and 2.

Figure 8D:
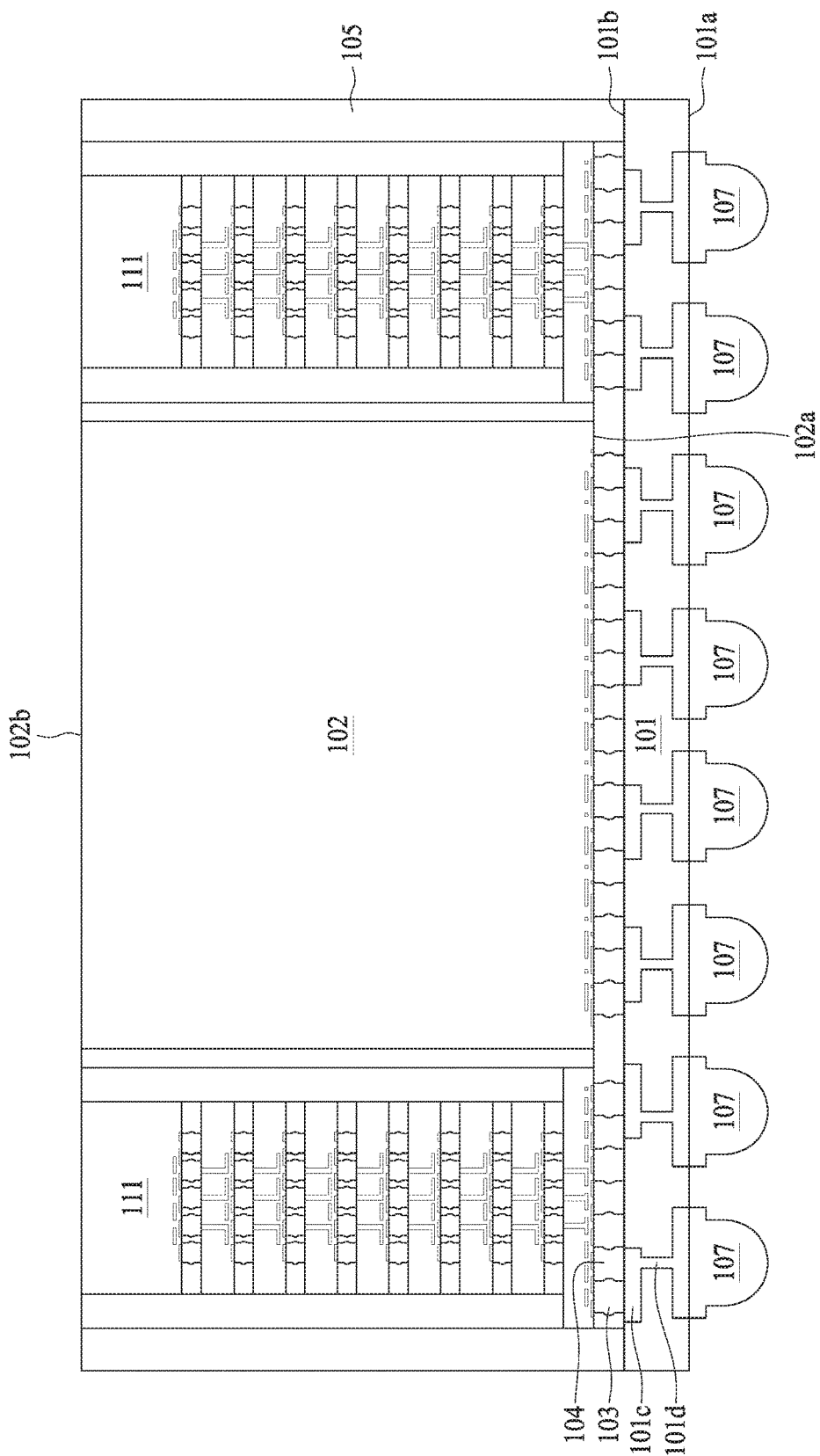

In operation 404, a second conductive bump 107 is disposed below the first substrate 101 as shown in FIG. 8D. In some embodiments, the second conductive bump 107 is disposed under and protruded from the first surface 101a of the first substrate 101. In some embodiments, the second conductive bump 107 is electrically connected to the first substrate 101 and the first die 102. In some embodiments, the second conductive bump 107 is disposed at the first conductive pad 101c or below the first via 101d. In some embodiments, the second conductive bump 107 is disposed by ball dropping, solder pasting, stencil printing or any other suitable operations. In some embodiments, the second conductive bump 107 is a solder joint, a solder bump, a solder ball, a ball grid array (BGA) ball, a controlled collapse chip connection (C4) bump, microbump or the like. In some embodiments, the second conductive bump 107 is a conductive pillar or post. In some embodiments, second conductive bump 107 has configuration similar to the one described above or illustrated in FIGS. 1 and 2.

Figure 8E:
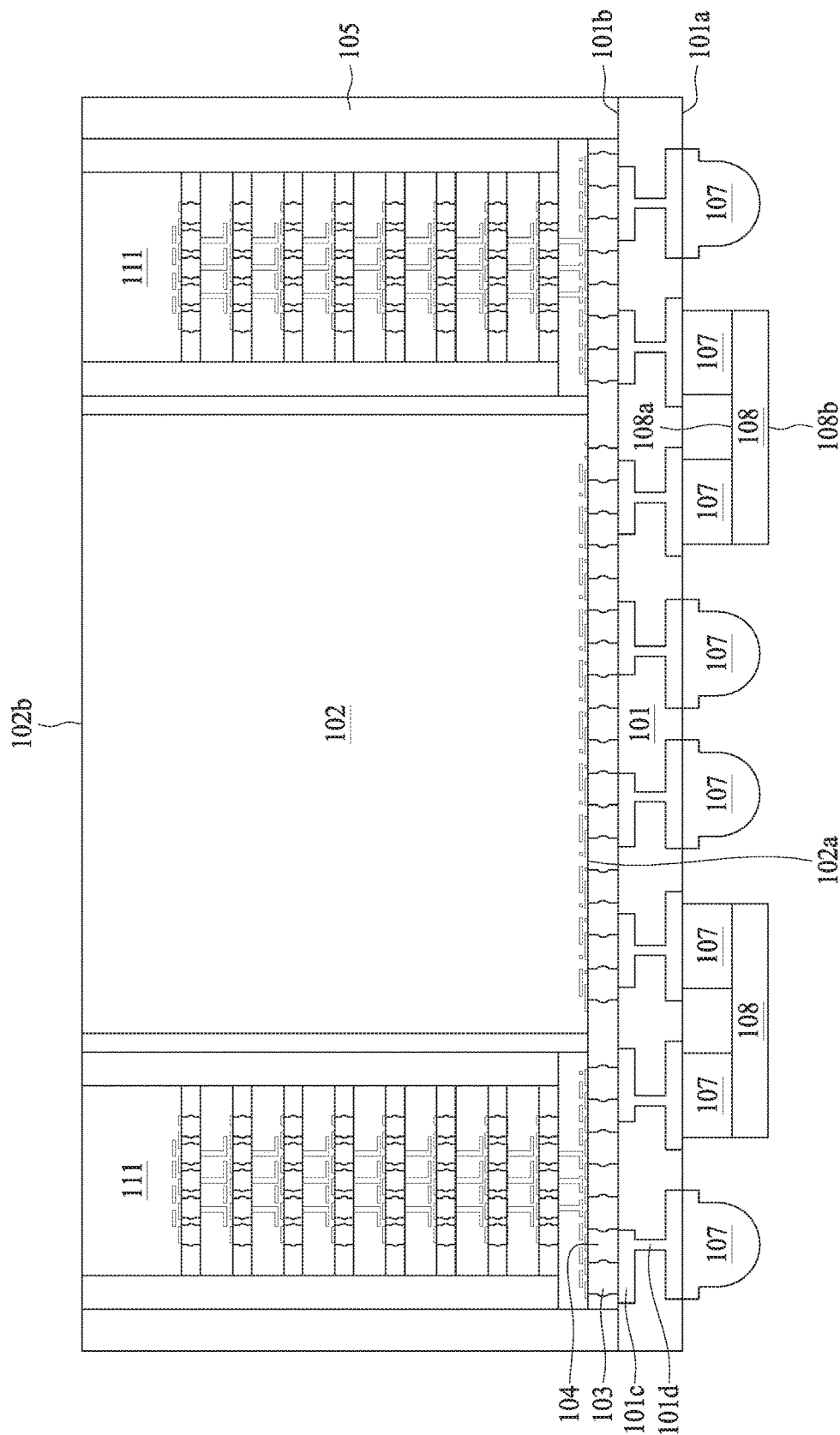

In operation 405, a second die 108 is bonded below the first substrate 101 as shown in FIG. 8E. In some embodiments, the second die 108 is disposed below the first surface 101a of the first substrate 101. In some embodiments, the second die 108 is bonded below the first substrate 101 by the second conductive bump 107. In some embodiments, the second die 108 is an integrated passive die (IPD). In some embodiments, the second die 108 includes a capacitor, a passive device or the like. In some embodiments, the second die 108 includes a seventh surface 108a and a eighth surface 108b opposite to the seventh surface 108a. In some embodiments, the first surface 101a of the first substrate 101 is bonded with the seventh surface 108a of the second die 108 by the second conductive bump 107. In some embodiments, the second die 108 is surrounded by the second conductive bumps 107. In some embodiments, the second die 108 is disposed between two of the second conductive bumps 107. In some embodiments, the second die 108 has configuration similar to the one described above or illustrated in FIGS. 1 and 2.

Figure 8F:
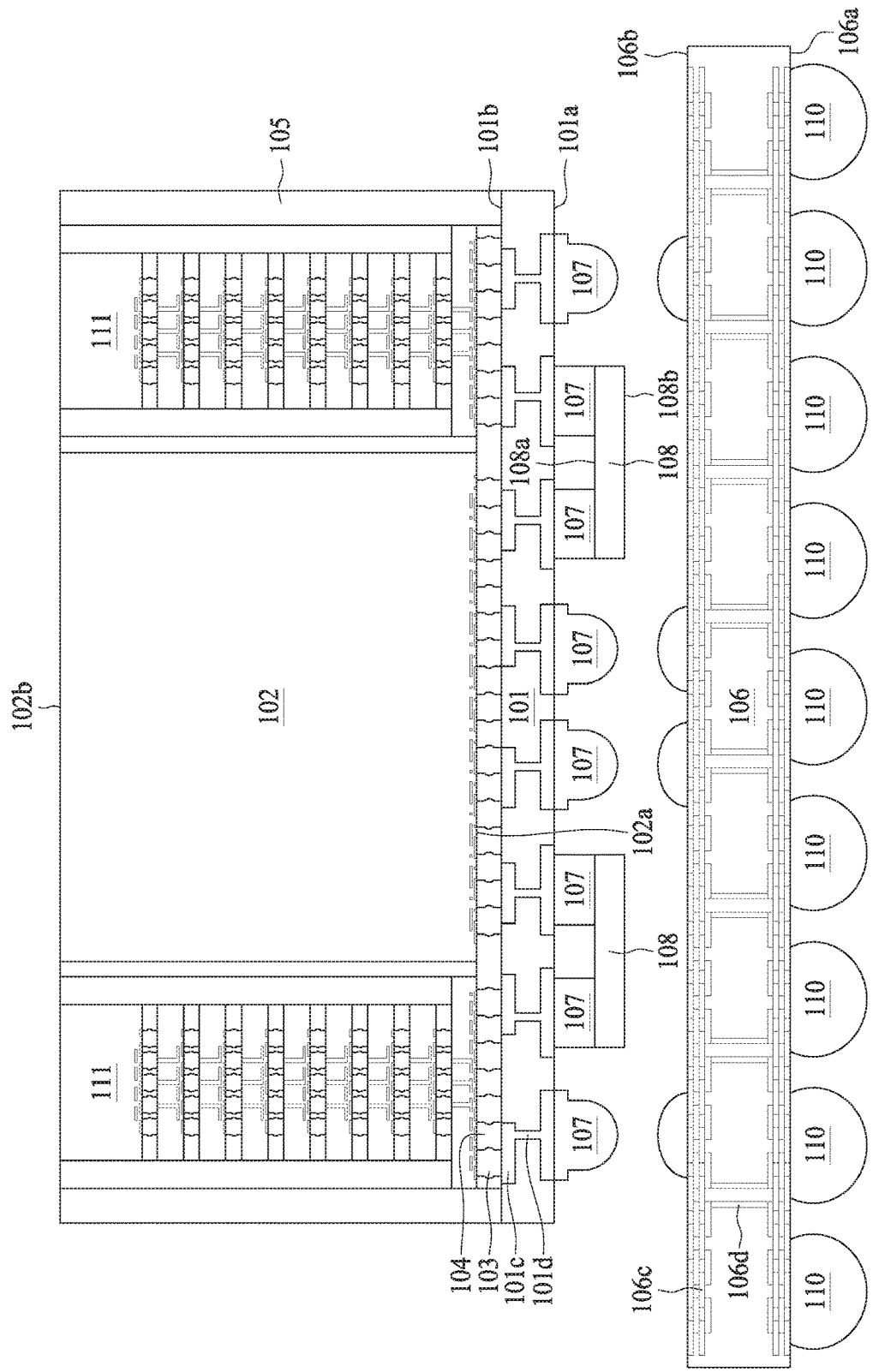

In operation 406, a second substrate 106 is provided or received as shown in FIG. 8F. In some embodiments, the second substrate 106 includes a fifth surface 106a and a sixth surface 106b opposite to the fifth surface 106a. In some embodiments, the second substrate 106 is a silicon substrate. In some embodiments, the second substrate 106 includes resin, glass or the like. In some embodiments, the second substrate 106 has configuration similar to the one described above or illustrated in FIGS. 1 and 2.

In some embodiments, a second conductive pad 106c is formed over the fifth surface 106a or the sixth surface 106b of the second substrate 106. In some embodiments, the second conductive pad 106c is formed by removing a portion of the second substrate 106 to form an opening, and then disposing a conductive material into the opening to form the second conductive pad 106c. In some embodiments, the removal of the portion of the second substrate 106 includes photolithography, etching or any other suitable operations. In some embodiments, the disposing of the conductive material includes sputtering, electroplating or any other suitable operations. In some embodiments, the conductive material includes copper, silver, gold, aluminum, etc. In some embodiments, the second conductive pad 106c has configuration similar to the one described above or illustrated in FIGS. 1 and 2.

In some embodiments, a second via 106d is formed within the second substrate 106. In some embodiments, the second via 106d is extended through the second substrate 106. In some embodiments, the second via 106d is electrically connected with the second conductive pad 106c. In some embodiments, the second via 106d is extended between fifth surface 106a and the sixth surface 106b of the second substrate 106. In some embodiments, the second via 106d is a plated through hole (PTH). In some embodiments, the second via 106d is formed by removing a portion of the second substrate 106 to form an opening and then disposing a conductive material into the opening to form the second via 106d. In some embodiments, the removal of the portion of the second substrate 106 includes photolithography, etching or any other suitable operations. In some embodiments, the disposing of the conductive material includes sputtering, electroplating or any other suitable operations. In some embodiments, the conductive material includes copper, silver, gold, aluminum, etc. In some embodiments, the second via 106d has configuration similar to the one described above or illustrated in FIGS. 1 and 2.

In some embodiments, a third conductive bump 110 is bonded at the second conductive pad 106c. In some embodiments, the third conductive bump 110 is protruded from the fifth surface 106a of the second substrate 106. In some embodiments, the third conductive bump 110 is electrically connected to the second substrate 106 and the second conductive pad 106c. In some embodiments, the third conductive bump 110 is disposed at the second conductive pad 106c or below the second via 106d. In some embodiments, the third conductive bump 110 is disposed by ball dropping, solder pasting, stencil printing or any other suitable operations. In some embodiments, the third conductive bump 110 is a solder joint, a solder bump, a solder ball, a ball grid array (BGA) ball, a controlled collapse chip connection (C4) bump, microbump or the like. In some embodiments, the third conductive bump 110 is a conductive pillar or post. In some embodiments, third conductive bump 110 has configuration similar to the one described above or illustrated in FIGS. 1 and 2.

Figure 8G:
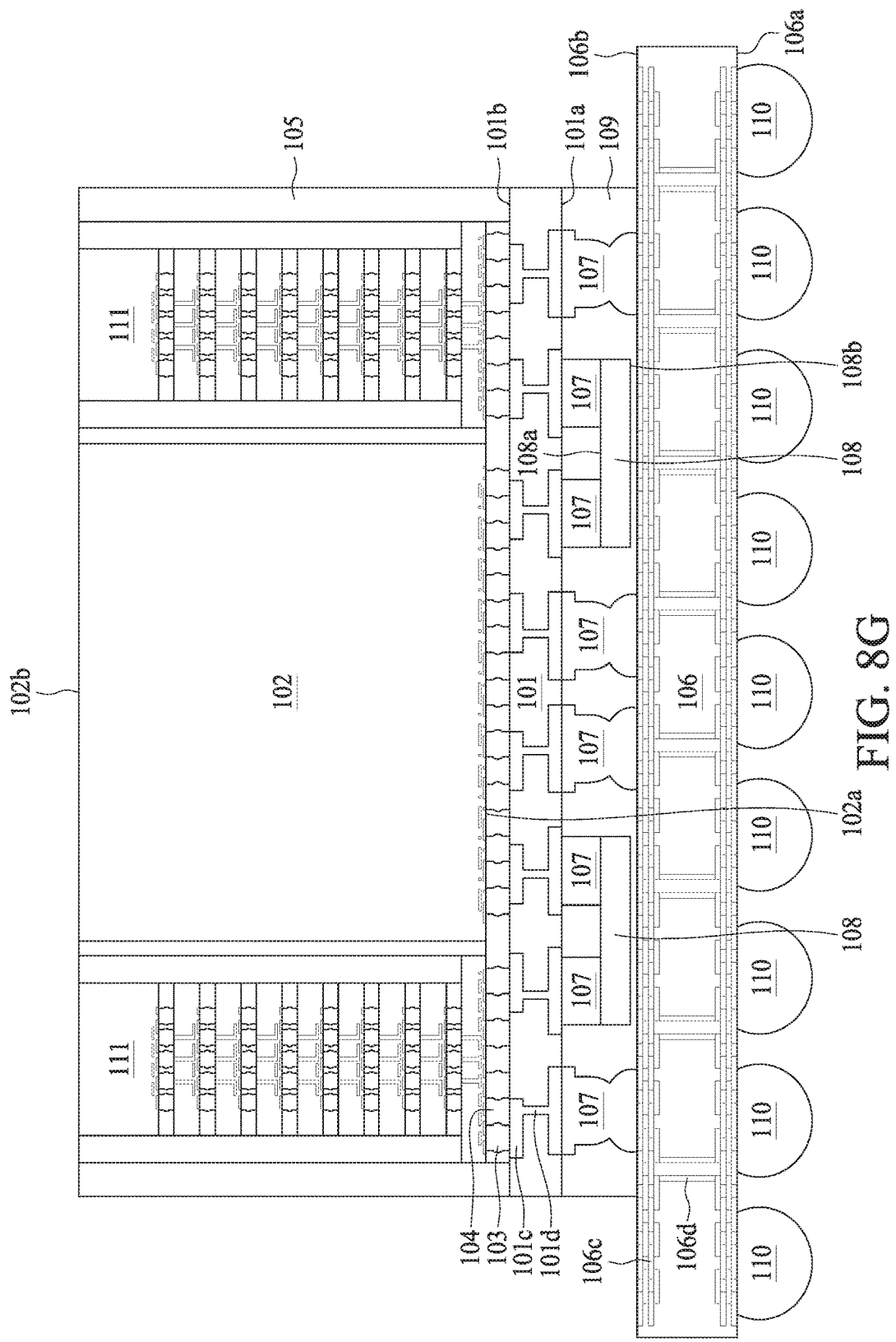

In operation 407, the first substrate 101 is bonded over the second substrate 106 by the second conductive bump 107 as shown in FIG. 8G. In some embodiments, the second die 108 is bonded below the first substrate 101 prior to the bonding of the first substrate 101 over the second substrate 106. In some embodiments, the second conductive bump 107 is disposed between the first surface 101a of the first substrate 101 and the sixth surface 106b of the second substrate 106. In some embodiments, the second substrate 106 is electrically connected to the first substrate 101 through the second conductive bump 107. In some embodiments, the second conductive bump 107 is bonded with the second conductive pad 106c. In some embodiments, the third conductive bump 110 is electrically connected to the second conductive bump 107 through the second conductive pad 106c and the second via 106d.

In some embodiments, a second underfill material 109 is disposed over the sixth surface 106b of the second substrate 106 and surrounds the second conductive bump 107, the second die 108 and a portion of the first substrate 101. In some embodiments, the second underfill material 109 is disposed between the first substrate 101 and the second substrate 106. In some embodiments, the second underfill material 109 fills gap between adjacent second conductive bumps 107 or between the second conductive bump 107 and the second die 108. In some embodiments, the second die 108 and the second conductive bump 107 are encapsulated by the second underfill material 109. In some embodiments, the second underfill material 109 is disposed by flowing, injection or any other suitable operations. In some embodiments, the second underfill material 109 has configuration similar to the one described above or illustrated in FIGS. 1 and 2. In some embodiments, a semiconductor structure 100 is formed.

Figure 9:
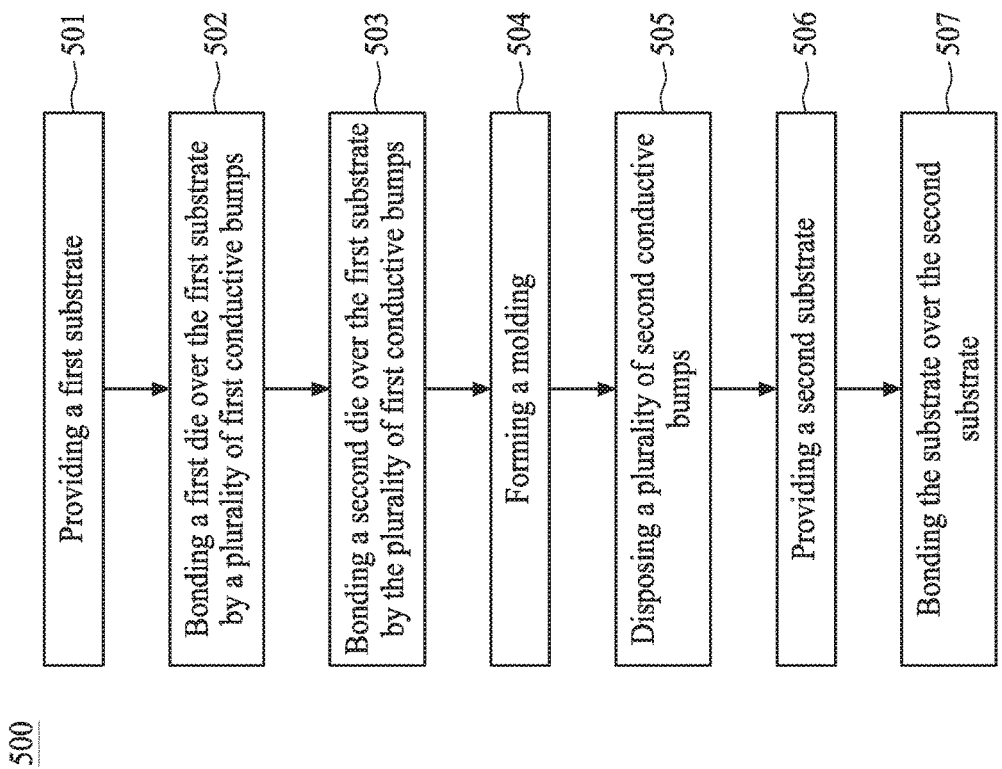
FIG. 9 is a flow diagram of a method of manufacturing a semiconductor structure in accordance with some embodiments of the present disclosure.

In the present disclosure, a method of manufacturing a semiconductor structure (200/200' or 300/300') is also disclosed. In some embodiments, the semiconductor structure (200 or 300) is formed by a method 500. The method 500 includes a number of operations and the description and illustration are not deemed as a limitation as the sequence of the operations. FIG. 9 is an embodiment of the method 500 of manufacturing the semiconductor structure 100. The method 500 includes a number of operations (501, 502, 503, 504, 506 and 507).

Figure 10A:
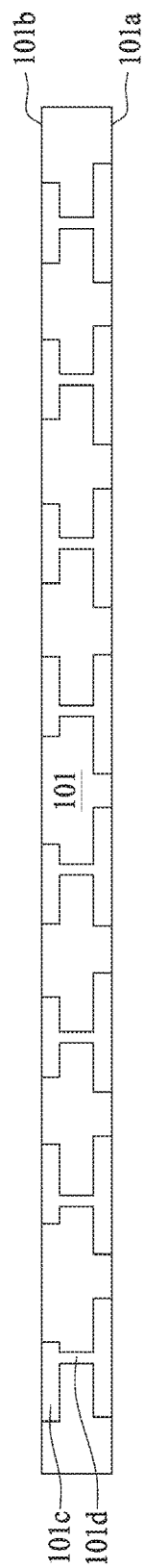

In operation 501, a first substrate 101 is provided or received as shown in FIG. 10A. In some embodiments, the operation 501 is same as the operation 401.

Figure 10B:
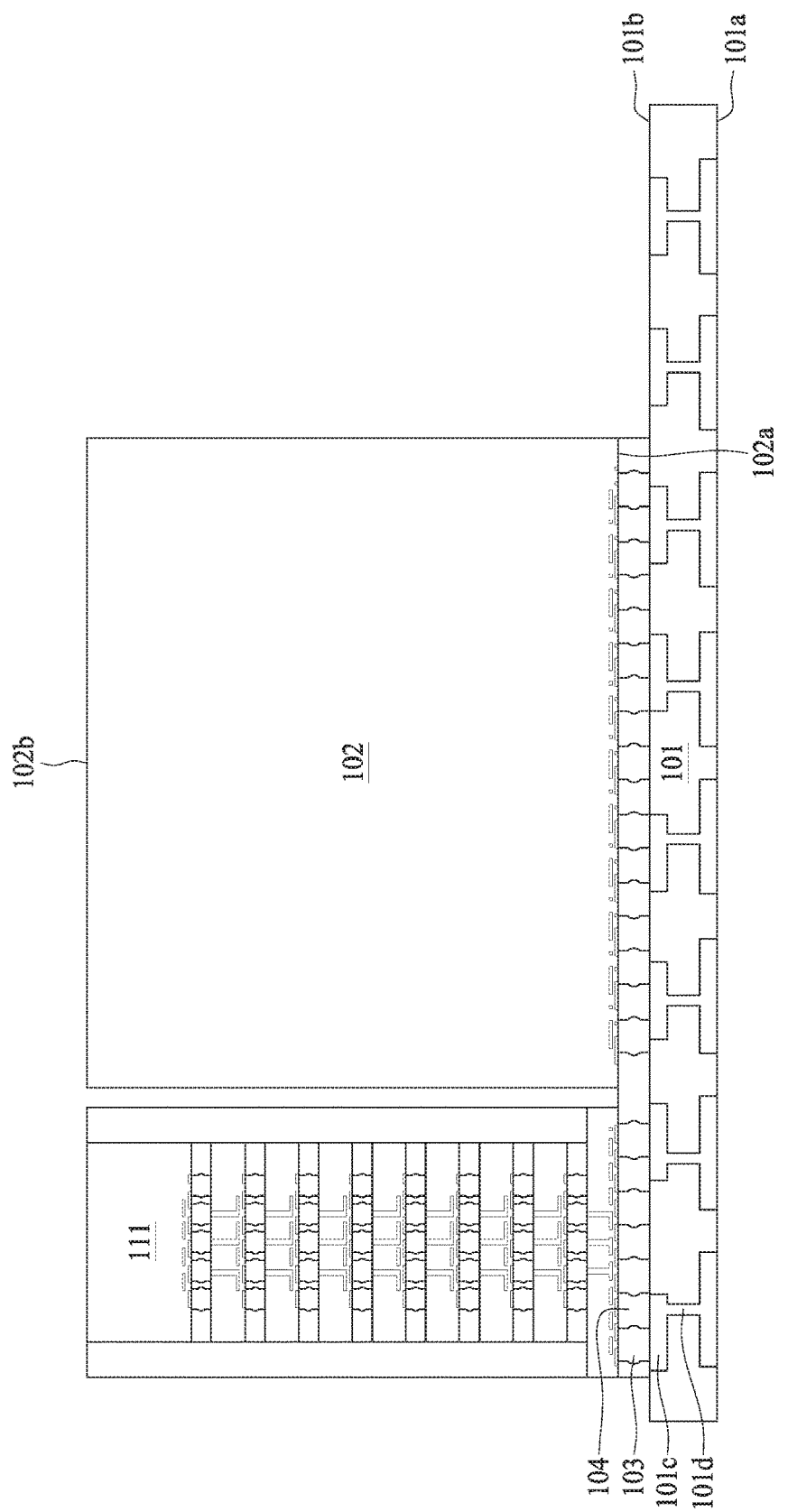

In operation 502, a first die 102 is bonded over the first substrate 101 by a first conductive bump 103 as shown in FIG. 10B. In some embodiments, the operation 502 is same as the operation 402. In some embodiments, a third die 111 is bonded over the first substrate 101 by a first conductive bump 103. In some embodiments, the third die 111 includes a plurality of HBM dies stacking over each other, and the HBM dies are electrically connected by several connectors.

Figure 10C:
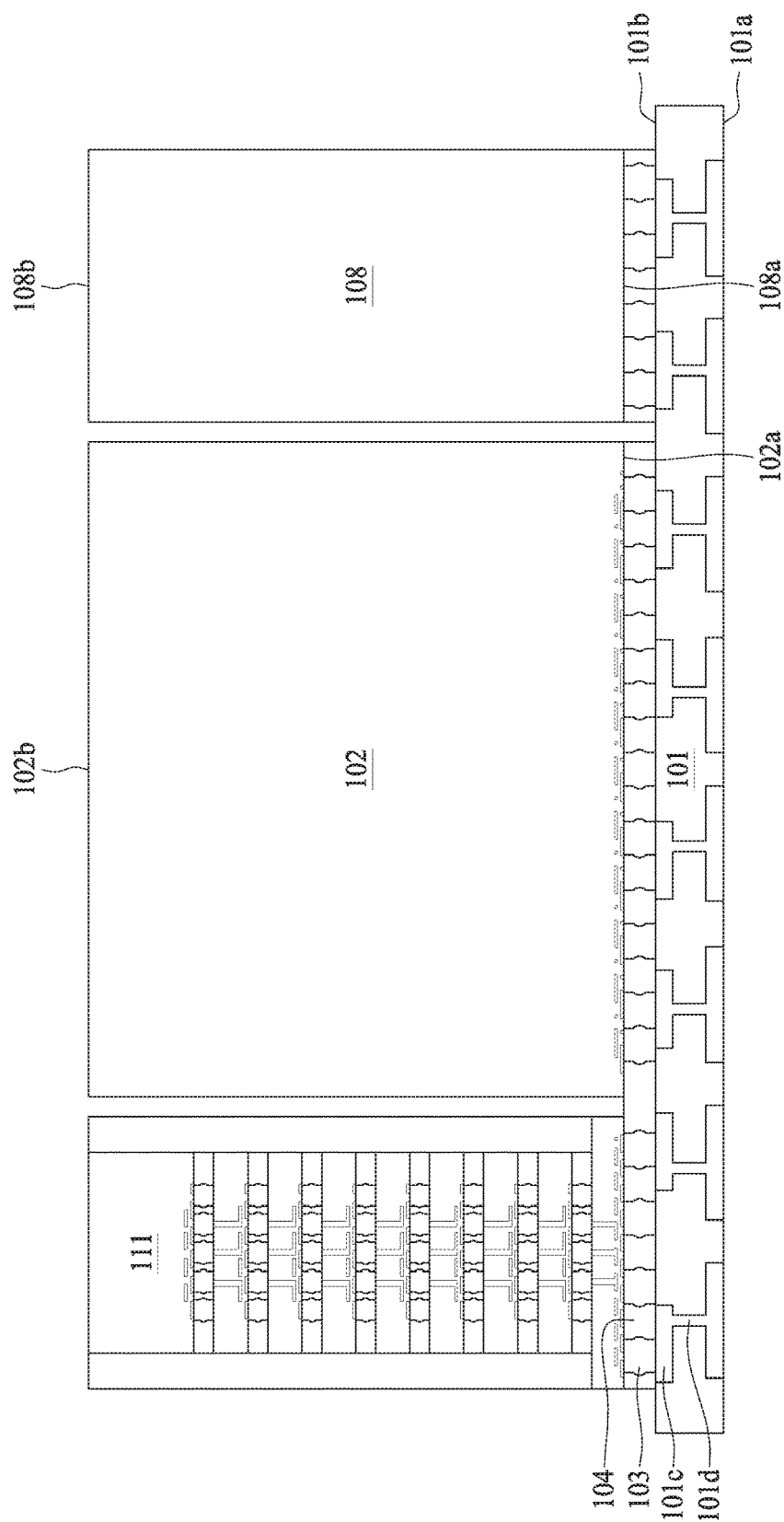

In operation 503, a second die 108 is bonded over the first substrate 101 by the first conductive bump 103 as shown in FIG. 10C. In some embodiments, the second die 108 is bonded over the second surface 101b of the first substrate 101 and adjacent to the first die 102. In some embodiments, the first conductive bump 103 is disposed between the second die 108 and the first substrate 101. In some embodiments, a first underfill material 104 surrounds a portion of the second die 108 and the first conductive bump 103. In some embodiments, the second die 108 is a capacitive or passive device. In some embodiments, the second die 108 includes capacitor or passive device. In some embodiments, the second die 108 is an integrated passive device (IPD).

Figure 10D:
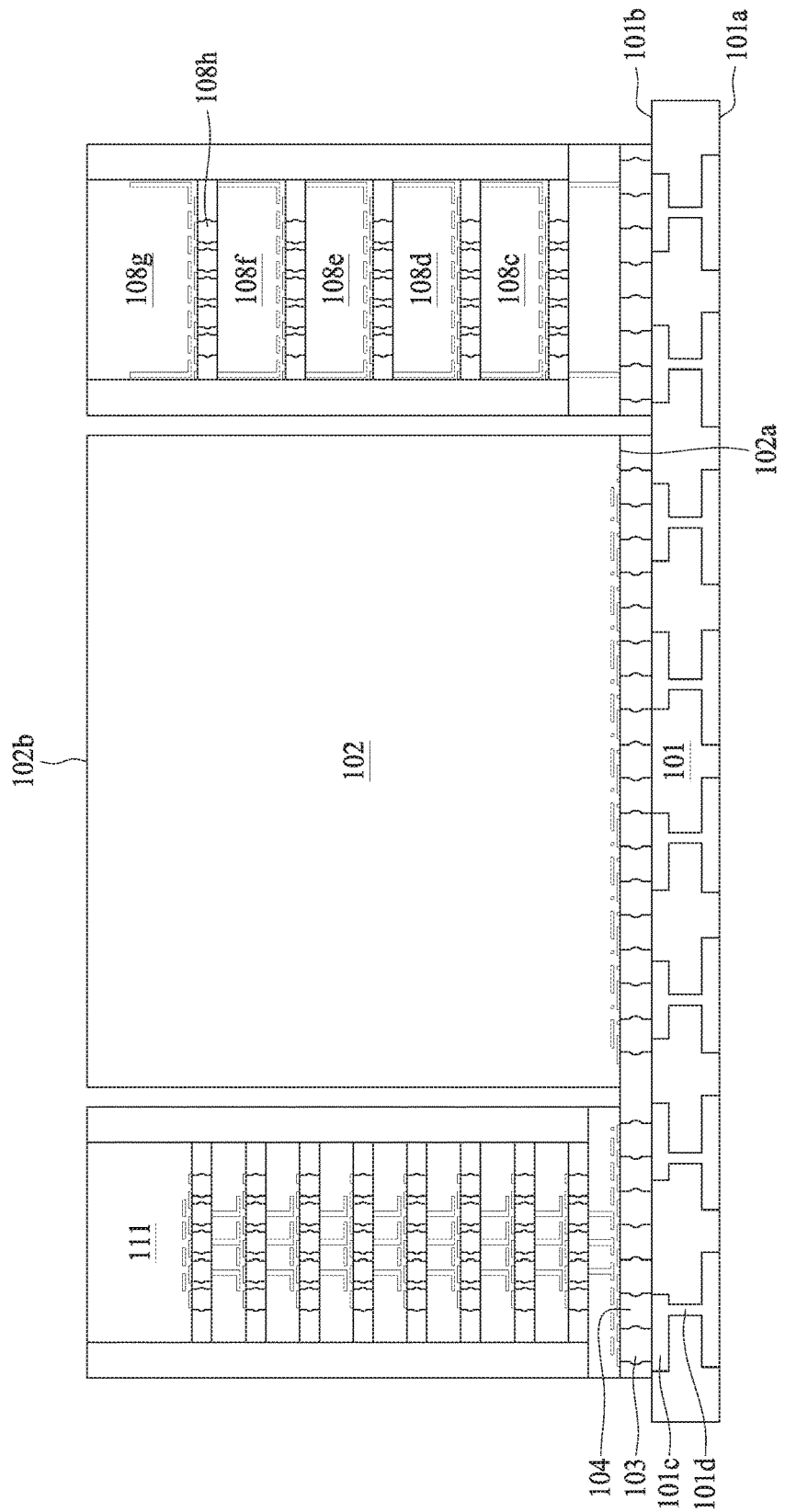

In some embodiments, the second die 108 includes several passive dies stacking over each other as shown in FIG. 10D. In some embodiments, the passive dies (108c, 108d, 108e, 108f, 108g) are electrically connected by several connectors 108h. In some embodiments, the connector 108h is a solder bump, a solder ball, microbump, conductive pillar or the like. In some embodiments, the second die 108 has configuration similar to the one described above or illustrated in FIG. 3, 4, 5 or 6.

Figure 10E:
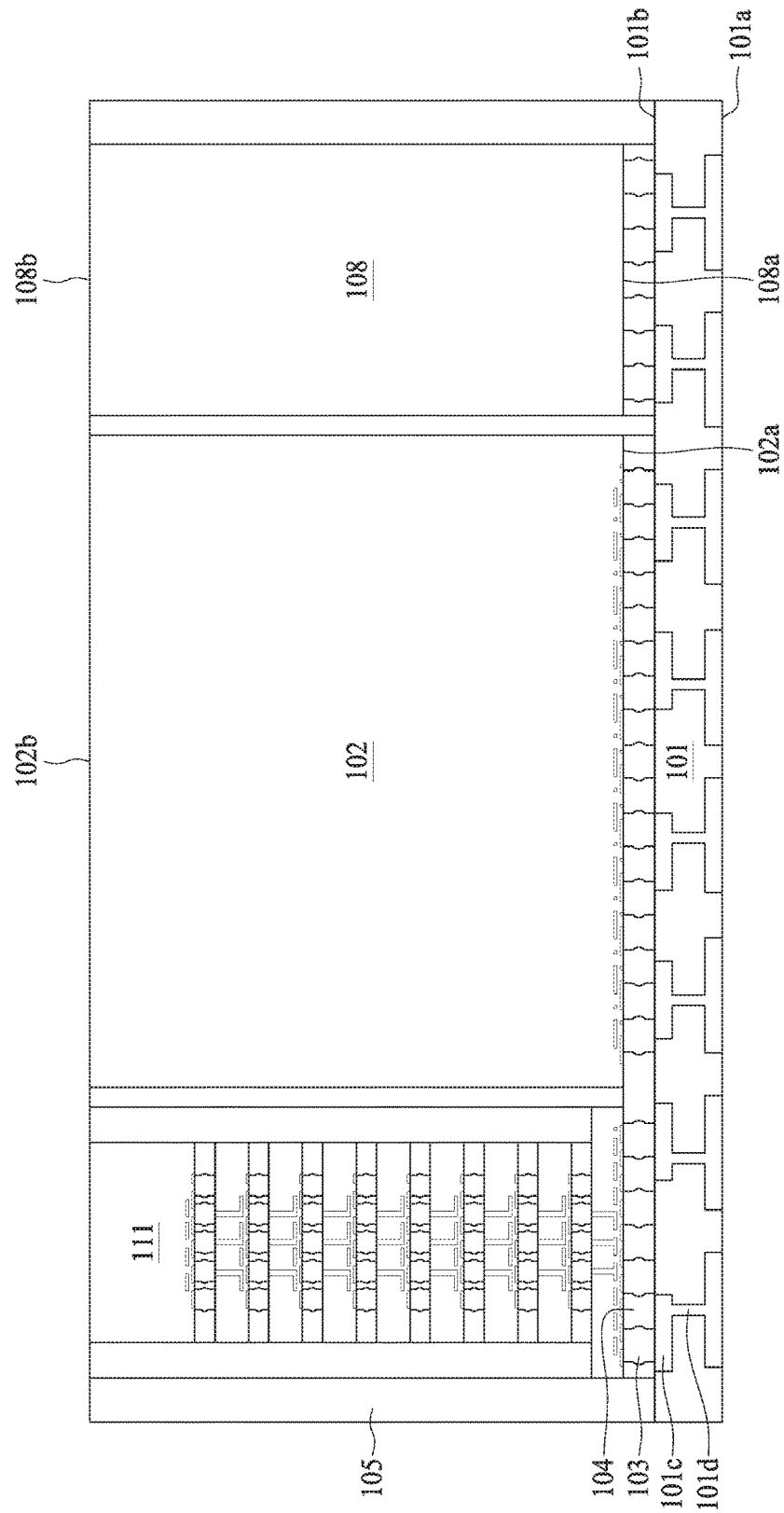

In operation 504, a molding 105 is formed as shown in FIG. 10E. In some embodiments, the first die 102, the second die 108 and the third die 111 are surrounded by the molding 105. In some embodiments, the molding 105 surrounds the first underfill material 104 and the first conductive bump 103. In some embodiments, the molding 105 is in contact with the first underfill material 104, a sidewall of the first die 102 and a sidewall of the second die 108. In some embodiments, a eighth surface 108b of the second die 108 is exposed from the molding 105. In some embodiments, the molding 105 has configuration similar to the one described above or illustrated in FIG. 3, 4, 5 or 6.

Figure 10F:
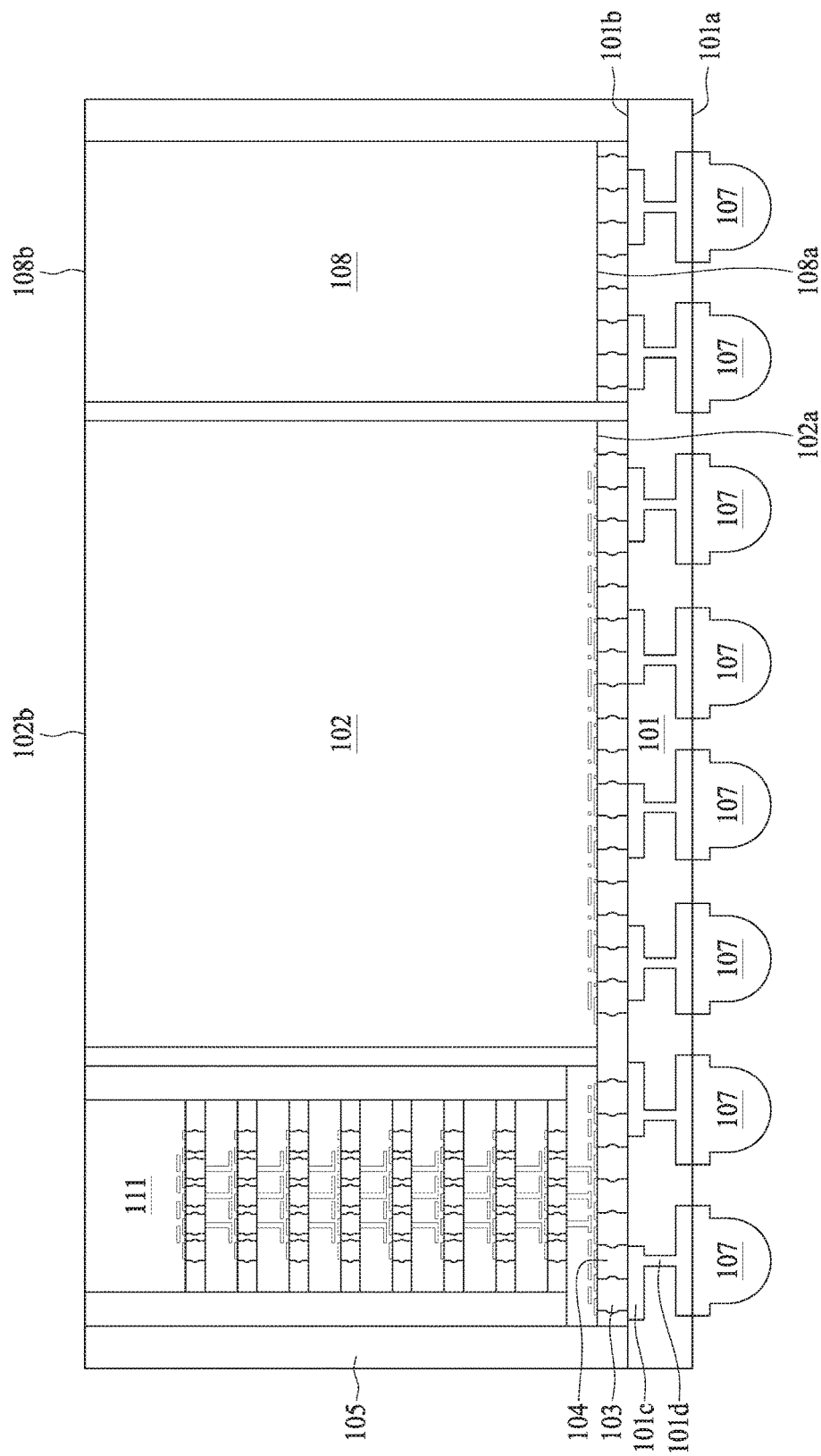

In operation 505, a second conductive bump 107 is disposed below the first substrate 101 as shown in FIG. 10F. In some embodiments, the operation 505 is same as the operation 404.

Figure 10G:
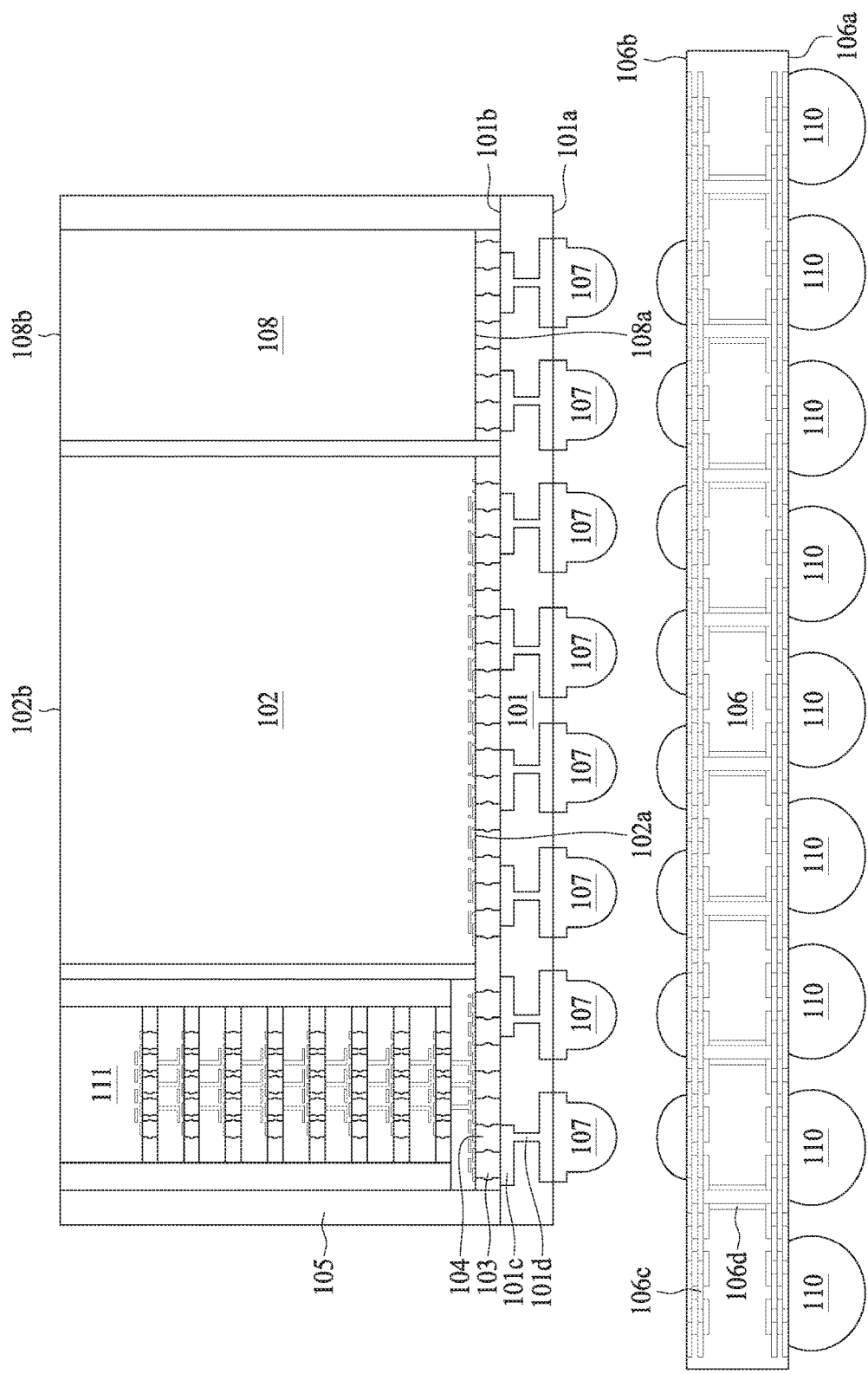

In operation 506, a second substrate 106 is provided or received as shown in FIG. 10G. In some embodiments, the operation 506 is same as the operation 406.

Figure 10I:
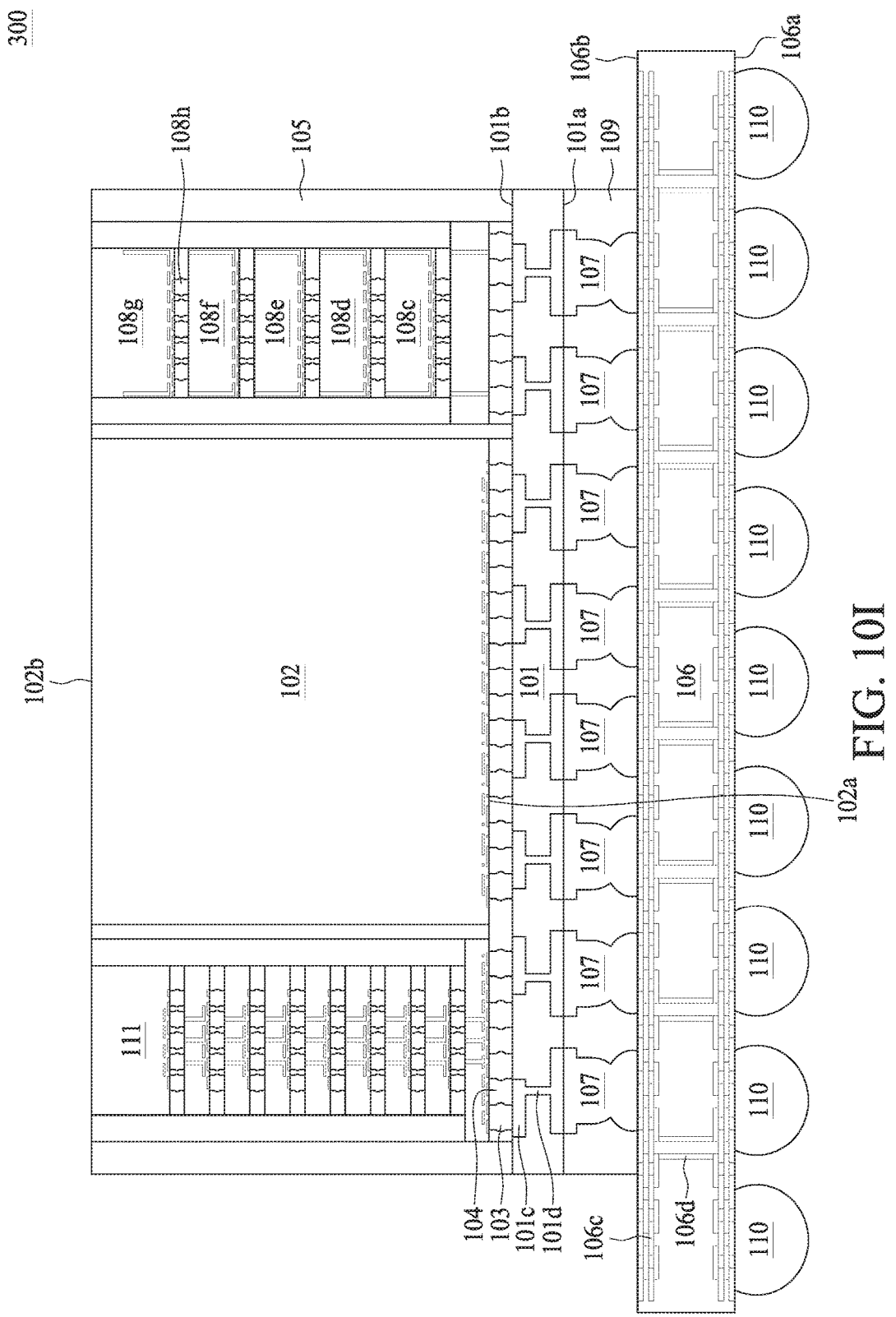

In operation 507, the first substrate 101 is bonded over the second substrate 106 by the second conductive bump 107 as shown in FIG. 10H. In some embodiments, the operation 507 is same as the operation 407. In some embodiments, a semiconductor structure (200/200', 300/300') is formed as shown in FIG. 10H or 10I.

In the present disclosure, a semiconductor structure is disclosed. The semiconductor structure includes a first substrate, a first die disposed over a surface of the first substrate and a second die disposed over an opposite surface of the first substrate. The second die is bonded with the first substrate and surrounded by the conductive bumps. Since the second die is bonded and electrically connected with the first substrate, an electrical connection between the first die and the second die is minimized and an electrical performance of the semiconductor structure is improved.

In some embodiments, a semiconductor structure includes a first substrate including a first surface and a second surface opposite to the first surface; a first die disposed over the second surface of the first substrate; a plurality of first conductive bumps disposed between the first die and the first substrate; a molding disposed over the first substrate and surrounding the first die and the plurality of first conductive bumps; a second substrate disposed below the first surface of the first substrate; a plurality of second conductive bumps disposed between the first substrate and the second substrate; and a second die disposed between the first substrate and the second substrate.

In some embodiments, at least one of the plurality of second conductive bumps is disposed between the first substrate and the second die. In some embodiments, the second die is attached to the first surface of the first substrate by at least one of the plurality of second conductive bumps. In some embodiments, the second die is disposed between the first die and the second substrate or between the molding and the second substrate. In some embodiments, the second die includes a capacitor or a passive device. In some embodiments, the first die is a logic or memory die. In some embodiments, the semiconductor structure further includes an underfill material disposed between the first substrate and the second substrate and surrounding the plurality of second conductive bumps and the second die. In some embodiments, the second die is entirely encapsulated by the underfill material. In some embodiments, at least a portion of the underfill material is disposed between the second die and the second substrate. In some embodiments, a surface and a sidewall of the second die are in contact with the underfill material. In some embodiments, at least one of the plurality of second conductive bumps is disposed between the second die and a sidewall of the underfill material. In some embodiments, the semiconductor structure further includes a plurality of third conductive bumps disposed below the second substrate; a via extended through the first substrate and electrically connecting the first die with the second die.

In some embodiments, a semiconductor structure includes a first substrate including a first surface and a second surface opposite to the first surface; a first die disposed over the second surface of the first substrate; a second die disposed over the second surface of the first substrate and adjacent to the first die; a plurality of first conductive bumps disposed between the first die and the first substrate and between the second die and the first substrate; a first underfill material surrounding the plurality of first conductive bumps; a molding disposed over the first substrate and surrounding the first die, the second die, the plurality of first conductive bumps and the first underfill material; a second substrate disposed below the first surface of the first substrate; a plurality of second conductive bumps disposed between the first substrate and the second substrate; a second underfill material disposed between the first substrate and the second substrate and surrounding the plurality of second conductive bumps; and a plurality of third conductive bumps disposed below the second substrate, wherein the second die includes a capacitive or passive device.

In some embodiments, the second die includes a plurality of passive dies stacking over each other. In some embodiments, a surface of the first die and a surface of the second die are exposed from the molding, and a sidewall of the first die and a sidewall of the second die are in contact with the molding. In some embodiments, the first substrate includes silicon, and the second substrate includes resin.

In some embodiments, a method of manufacturing a semiconductor structure includes providing a first substrate including a first surface and a second surface opposite to the first surface; bonding a first die over the second surface of the first substrate by a plurality of first conductive bumps; forming a molding around the first die and the plurality of first conductive bumps; disposing a plurality of second conductive bumps at the first surface of the first substrate; bonding a second die below the first surface of the first substrate; providing a second substrate; and bonding the first substrate over the second substrate by the plurality of second conductive bumps.

In some embodiments, the second die is bonded below the first surface of the first substrate prior to the bonding of the first substrate over the second substrate. In some embodiments, the second die is bonded below the first surface of the first substrate by at least one of the plurality of second conductive bumps. In some embodiments, the method further includes disposing an underfill material between the first substrate and the second substrate to encapsulate the second die and the plurality of second conductive bumps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
a first substrate including a first surface and a second surface opposite to the first surface;
a first die disposed over the second surface of the first substrate;
a plurality of first conductive bumps disposed between the first die and the first substrate;
a molding disposed over and contacted with the second surface of the first substrate and surrounding the first die and the plurality of first conductive bumps;
a second substrate disposed below the first surface of the first substrate;
a plurality of second conductive bumps disposed between the first substrate and the second substrate;
a second die disposed between the first substrate and the second substrate; and
a plurality of stacked memory dies to surround the first die,
wherein the first die includes a fourth surface exposed from the molding, the molding includes a surface substantially horizontally coplanar with the fourth surface of the first die, a width of the second substrate is substantially greater than a total width of the fourth surface of the first die and the surface of the molding.

2. The semiconductor structure of claim 1, wherein at least one of the plurality of second conductive bumps is disposed between the first substrate and the second die.

3. The semiconductor structure of claim 1, wherein the second die is attached to the first surface of the first substrate by at least one of the plurality of second conductive bumps.

4. The semiconductor structure of claim 1, wherein the second die is disposed between the first die and the second substrate or between the molding and the second substrate.

5. The semiconductor structure of claim 1, wherein the second die includes a capacitor or a passive device.

6. The semiconductor structure of claim 1, wherein the first die is a logic or memory die.

7. The semiconductor structure of claim 1, further comprising an underfill material disposed between the first substrate and the second substrate and surrounding the plurality of second conductive bumps and the second die.

8. The semiconductor structure of claim 7, wherein the second die is entirely encapsulated by the underfill material.

9. The semiconductor structure of claim 7, wherein at least a portion of the underfill material is disposed between the second die and the second substrate.

10. The semiconductor structure of claim 7, wherein a surface and a sidewall of the second die are in contact with the underfill material.

11. The semiconductor structure of claim 7, wherein at least one of the plurality of second conductive bumps is disposed between the second die and a sidewall of the underfill material.

12. The semiconductor structure of claim 1, further comprising:
a plurality of third conductive bumps disposed below the second substrate;
a via extended through the first substrate and electrically connecting the first die with the second die.

13. A semiconductor structure, comprising:
a first substrate including a first surface and a second surface opposite to the first surface;
a first die disposed over the second surface of the first substrate;
a second die disposed over the second surface of the first substrate and adjacent to the first die;
a plurality of stacked dies to surround the first die;
a plurality of first conductive bumps disposed between the first die and the first substrate and between the second die and the first substrate;
a first underfill material surrounding the plurality of first conductive bumps;
a molding disposed over the first substrate and surrounding the first die, the second die, the plurality of first conductive bumps and the first underfill material;
a second substrate disposed below the first surface of the first substrate;
a plurality of second conductive bumps disposed between the first substrate and the second substrate;
a second underfill material disposed between the first substrate and the second substrate and surrounding the plurality of second conductive bumps; and
a plurality of third conductive bumps disposed below the second substrate,
wherein the second die includes a capacitive or passive device, the first die includes a fourth surface exposed from the molding, the second die includes an eighth surface exposed from the molding, the molding includes a surface substantially horizontally coplanar with the fourth surface of the first die and the eighth surface of the second die, a first width of the second underfill material is substantially greater than a second total width of the fourth surface, the eighth surface and the surface of the molding, a third width of the second substrate is substantially greater than the first width and the second total width.

14. The semiconductor structure of claim 13, wherein the second die includes a plurality of passive dies stacking over each other.

15. The semiconductor structure of claim 13, wherein a sidewall of the first die and a sidewall of the second die are in contact with the molding.

16. The semiconductor structure of claim 13, wherein the first substrate includes silicon, and the second substrate includes resin.

17. A method of manufacturing a semiconductor structure, comprising:
providing a first substrate including a first surface and a second surface opposite to the first surface;
bonding a first die over the second surface of the first substrate by a plurality of first conductive bumps;
bonding a plurality of stacked memory dies to surround the first die;
forming a molding around the first die and the plurality of first conductive bumps;
disposing a plurality of second conductive bumps at the first surface of the first substrate;
bonding a second die below the first surface of the first substrate;
providing a second substrate; and
bonding the first substrate over the second substrate by the plurality of second conductive bumps,
wherein the formation of the molding includes exposing a fourth surface of the first die from the molding and forming a surface of the molding substantially horizontally coplanar with the fourth surface of the first die, a width of the second substrate is substantially greater than a total width of the fourth surface of the first die and the surface of the molding.

18. The method of claim 17, wherein the second die is bonded below the first surface of the first substrate prior to the bonding of the first substrate over the second substrate.

19. The method of claim 17, wherein the second die is bonded below the first surface of the first substrate by at least one of the plurality of second conductive bumps.

20. The method of claim 17, further comprising disposing an underfill material between the first substrate and the second substrate to encapsulate the second die and the plurality of second conductive bumps.

* * * * *